(12) United States Patent
Rie et al.

(10) Patent No.: US 11,791,811 B2
(45) Date of Patent: Oct. 17, 2023

(54) DELAY CIRCUIT AND CLOCK ERROR CORRECTION DEVICE INCLUDING THE SAME

(71) Applicant: Samsung Electronics Co., Ltd., Suwon-si (KR)

(72) Inventors: Hyunsub Rie, Yongin-si (KR); Eunseok Shin, Seoul (KR); Youngdon Choi, Seoul (KR); Junyoung Park, Seoul (KR); Hyunyoon Cho, Uiwang-si (KR); Junghwan Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/806,827

(22) Filed: Jun. 14, 2022

(65) Prior Publication Data
US 2023/0110301 A1   Apr. 13, 2023

(30) Foreign Application Priority Data
Oct. 13, 2021   (KR) ........................ 10-2021-0135742

(51) Int. Cl.
*H03K 5/156*   (2006.01)
*G11C 7/22*    (2006.01)
(Continued)

(52) U.S. Cl.
CPC .......... *H03K 5/1565* (2013.01); *G11C 7/222* (2013.01); *H03K 3/017* (2013.01); *H03K 5/135* (2013.01); *H03K 2005/00241* (2013.01)

(58) Field of Classification Search
None
See application file for complete search history.

(56) References Cited

U.S. PATENT DOCUMENTS 7,348,823 B2 *  3/2008  Takai ................. H03L 7/0818
                                            327/158
7,840,831 B2    11/2010  Jang
(Continued)

FOREIGN PATENT DOCUMENTS

KR        101016555 B1    2/2011
KR    1020210069530 A     6/2021

*Primary Examiner* — Cassandra F Cox
(74) *Attorney, Agent, or Firm* — Myers Bigel, P.A.

(57) ABSTRACT

A delay circuit for a clock signal includes a first signal generator, a first inverting circuit, a second signal generator and a second inverting circuit. The first signal generator is configured to generate a plurality of first switching signals based on a delay code. The first inverting circuit includes a plurality of first inverters that are selectively turned on in response to the plurality of first switching signals, respectively, and is configured to adjust a first delay time for both of a first edge and a second edge of the clock signal. The second signal generator is configured to generate a plurality of second switching signals based on a duty code. The second inverting circuit includes a plurality of second pull-up units and a plurality of second pull-down units, respective ones of the plurality of second pull-up units or respective ones of the plurality of second pull-down units are selectively turned on in response to respective ones of the plurality of second switching signals. The second inverting circuit is configured to adjust a second delay time for the first edge, the second edge, or both of the first edge and the second edge of the clock signal.

11 Claims, 15 Drawing Sheets

(51) Int. Cl.
*H03K 5/135* (2006.01)
*H03K 3/017* (2006.01)
*H03K 5/00* (2006.01)

(56) References Cited

U.S. PATENT DOCUMENTS

| | | |
|---|---|---|
| 8,797,076 B2 | 8/2014 | Kibune |
| 9,412,428 B2 | 8/2016 | Giovannini et al. |
| 9,602,082 B2 | 3/2017 | Hedayati et al. |
| 10,630,272 B1 | 4/2020 | Ashtiani et al. |
| 10,784,845 B2 | 9/2020 | Doppalapudi et al. |
| 11,121,716 B2 | 9/2021 | Shin et al. |
| 2010/0283525 A1* | 11/2010 | Yoshikawa ............ H03L 7/0998 327/237 |

* cited by examiner

CORRECTION LOOP

DELAY CIRCUIT AND CLOCK ERROR CORRECTION DEVICE INCLUDING THE SAME

CROSS-REFERENCE TO RELATED APPLICATION

This application claims priority under 35 USC § 119 to Korean Patent Application No. 10-2021-0135742, filed on Oct. 13, 2021 in the Korean Intellectual Property Office (KIPO), the contents of which are herein incorporated by reference in their entirety.

BACKGROUND

1. Technical Field

Example embodiments relate generally to a semiconductor integrated circuit, and, more particularly, to a delay circuit for a clock signal, and a clock error correction device including the delay circuit.

2. Description of the Related Art

A semiconductor circuit or an electronic device may operate based on a clock signal. Further, in various semiconductor circuits, a multi-phase clock signal including a plurality of clock signals having different phases may be used. However, in a circuit using the multi-phase clock signal, a phase error (e.g., a quadrature error or a skew) in which the plurality of clock signals have a undesired phase difference, or a duty cycle error in which each clock signal has a undesired duty cycle may occur. Thus, a phase error corrector (e.g., a quadrature error corrector) may be used to correct the phase error, and a duty cycle corrector may be used to correct the duty cycle error. However, even if the phase error corrector and the duty cycle corrector are used, the duty cycle error of the multi-phase clock signal may be caused as a result of the phase error corrector correcting the phase error, and/or the phase error of the multi-phase clock signal may be caused as a result of the duty cycle corrector correcting the duty cycle error.

SUMMARY

At least one example embodiment of the present disclosure provides a delay circuit being suitable for correcting both a phase error and a duty cycle error.

At least one example embodiment of the present disclosure provides a clock error correction device that corrects both of a phase error and a duty cycle error.

According to example embodiments, a delay circuit for a clock signal includes a first signal generator, a first inverting circuit, a second signal generator and a second inverting circuit. The first signal generator is configured to generate a plurality of first switching signals based on a delay code. The first inverting circuit includes a plurality of first inverters that are selectively turned on in response to the plurality of first switching signals, and is configured to adjust a first delay time for both of a first edge and a second edge of the clock signal. The second signal generator generates a plurality of second switching signals based on a duty code. The second inverting circuit includes a plurality of second pull-up units and a plurality of second pull-down units, respective ones of the plurality of second pull-up units or respective ones of the plurality of second pull-down units are selectively turned on in response to respective ones of the plurality of second switching signals. The second inverting circuit is configured to adjust a second delay time for the first edge, the second edge, or the first edge and the second edge of the clock signal.

According to example embodiments, a clock error correction device for a plurality of clock signals having different phases includes a plurality of delay circuits, a multi-path selecting circuit, a phase detector and a code control circuit. The plurality of delay circuits is in paths of the plurality of clock signals, respectively. The multi-path selecting circuit is configured to select two adjacent clock signals of the plurality of clock signals output from the plurality of delay circuits in a phase correction period, delays one of the two adjacent clock signals by a clock interval in the phase correction period, selects two opposite clock signals of the plurality of clock signals output from the plurality of delay circuits in a duty correction period, and inverts one of the two opposite clock signals in the duty correction period. The phase detector is configured to compare phases of the two adjacent clock signals output from the multi-path selecting circuit in the phase correction period, and compares phases of the two opposite clock signals output from the multi-path selecting circuit in the duty correction period. The code control circuit is configured to store an interval code for the clock interval, to store a plurality of delay codes and a plurality of duty codes, to adjust the interval code and the plurality of delay codes in response to an output signal of the phase detector in the phase correction period, and to adjust the plurality of duty codes in response to the output signal of the phase detector in the duty correction period. Each of the plurality of delay circuits is configured to adjust a first delay time for both of a first edge and a second edge of a corresponding clock signal of the plurality of clock signals in response to a corresponding delay code of the plurality of delay codes, and to adjust a second delay time for the first edge, the second edge, or both the first edge and the second edge of the corresponding clock signal in response to a corresponding duty code of the plurality of duty codes.

According to example embodiments, a clock error correction device for first, second, third and fourth clock signals having different phases includes first, second, third and fourth delay circuits, a multi-path selecting circuit, a phase detector and a code control circuit. The first, second, third and fourth delay circuits are in paths of the first, second, third and fourth clock signals, respectively. The multi-path selecting circuit is configured to output the second clock signal and the first clock signal delayed by a clock interval in a first sub-period of a phase correction period, to output the third clock signal and the second clock signal delayed by the clock interval in a second sub-period of the phase correction period, to output the fourth clock signal and the third clock signal delayed by the clock interval in a third sub-period of the phase correction period, to output the first clock signal and the fourth clock signal delayed by the clock interval in a fourth sub-period of the phase correction period, and to output a first inverted clock signal by inverting the first clock signal and the third clock signal in a duty correction period. The phase detector is configured to compare a rising edge of the second clock signal and a rising edge of the first clock signal delayed by the clock interval in the first sub-period of the phase correction period, to compare a rising edge of the third clock signal and a rising edge of the second clock signal delayed by the clock interval in the second sub-period of the phase correction period, to compare a rising edge of the fourth clock signal and a rising edge of the third clock signal delayed by the clock interval in the third sub-period of the phase correction period, to compare a rising edge of the first clock signal and a rising edge of the fourth clock signal delayed by the clock interval in the fourth sub-period of the phase correction period, and to compare a rising edge of the first inverted clock signal and a rising edge of the third clock signal in the duty correction period. The code control circuit is configured to store an interval code for the clock interval, first, second, third and fourth delay codes for the first, second, third and fourth clock signals and to store first, second, third and fourth duty codes for the first, second, third and fourth clock signals, to adjust the second delay code in response to the output signal of the phase detector in the first sub-period of the phase correction period, to adjust the third delay code in response to the output signal of the phase detector in the second sub-period of the phase correction period, to adjust the fourth delay code in response to the output signal of the phase detector in the third sub-period of the phase correction period, to adjust the interval code in response to the output signal of the phase detector in the fourth sub-period of the phase correction period, and to adjust the first duty code in response to the output signal of the phase detector in the duty correction period. Each of the first, second, third and fourth delay circuits is configured to adjust a first delay time for both of a rising edge and a falling edge of a corresponding clock signal of the first, second, third and fourth clock signals in response to a corresponding delay code of the first, second, third and fourth delay codes, and is configured to adjust a second delay time for the rising edge, the falling edge, or both of the rising edge and the falling edge of the corresponding clock signal in response to a corresponding duty code of the first, second, third and fourth duty codes. The multi-path selecting circuit is configured to adjust the clock interval in response to the interval code.

As described above, a delay circuit according to example embodiments may be configured to adjust a first delay time for both of a first edge and a second edge of a clock signal based on a delay code, and may adjust a second delay time for one or both of the first edge and the second edge of the clock signal based on a duty code. Accordingly, the delay circuit may be used to correct both a phase error and a duty cycle error of a multi-phase clock signal.

Further, a clock error correction device according to example embodiments may correct a phase error of a plurality of clock signals by comparing first edges of two adjacent clock signals of the plurality of clock signals having different phases, and may correct a duty cycle error of the plurality of clock signals by adjusting a second edge of each clock signal by comparing the second edge of each clock signal with a first edge of a clock signal opposite to each clock signal. Accordingly, the clock error correction device may correct both the phase error and the duty cycle error of the plurality of clock signals.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
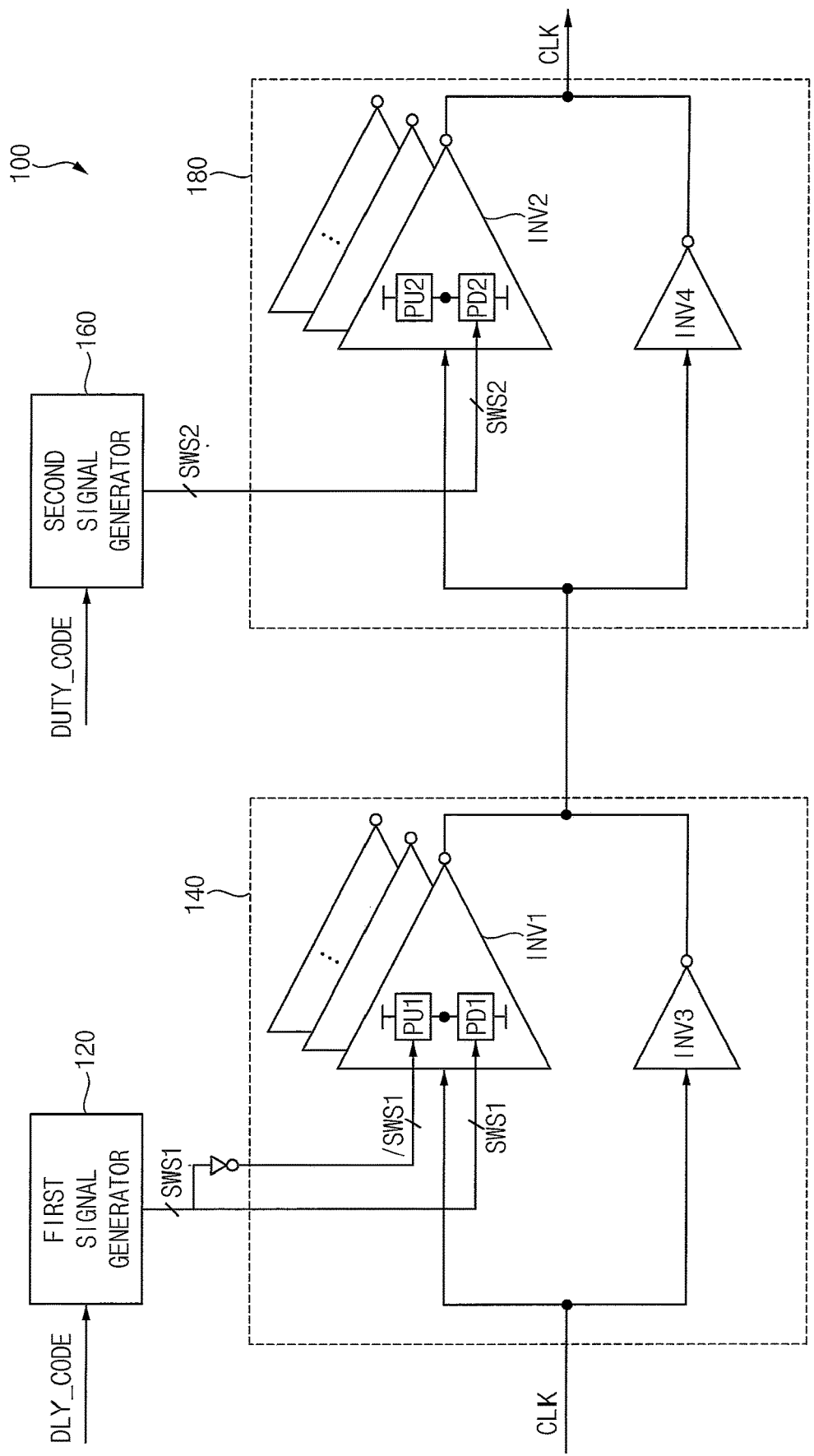
FIG. 1 is a block diagram illustrating a delay circuit according to example embodiments of the inventive concept.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram illustrating a delay circuit according to example embodiments of the inventive concept.

Referring to FIG. 1, a delay circuit 100 for a clock signal CLK may include a first signal generator 120, a first inverting circuit 140, a second signal generator 160 and a second inverting circuit 180.

The first signal generator 120 may be configured to generate a plurality of first switching signals SWS1 based on a delay code DLY_CODE. In some example embodiments, the delay code DLY_CODE may have N bits, and the first signal generator 120 may be configured to generate 2^N first switching signals SWS1, where N is an integer greater than 0. The first signal generator 120 may be further configured to generate a plurality of first inverted switching signals/SWS1 by inverting the plurality of first switching signals SWS1.

The first inverting circuit 140 may be configured to invert the clock signal CLK. The first inverting circuit 140 may include a plurality of first inverters INV1 that are connected in parallel with each other. In some example embodiments, the first inverting circuit 140 may further include a third inverter INV3 that is connected in parallel with the plurality of first inverters INV1.

Respective ones of plurality of first inverters INV1 may be selectively turned on in response to respective ones of the plurality of first switching signals SWS1. In some example embodiments, the plurality of first inverters INV1 may include a plurality of first pull-up units PU1 that are connected in parallel between a first power supply line (e.g., a high power supply line) and an output node of the first inverting circuit 140, and a plurality of first pull-down units PD1 that are connected in parallel between the output node and a second power supply line (e.g., a low power supply line). The plurality of first pull-down units PD1 may be selectively turned on in response to the plurality of first switching signals SWS1, respectively, and the plurality of first pull-up units PU1 may be selectively turned on in response to the plurality of first inverted switching signals/SWS1, respectively.

As the number of the turned-on first inverters INV1 increases, a first delay time by the first inverting circuit 140 for one or both of a first edge and a second edge of the clock signal CLK may decrease. Further, as the number of the turned-on first inverters INV1 decreases, the first delay time for one or both of the first edge and the second edge of the clock signal CLK may increase. Thus, the first inverting circuit 140 may be configured to adjust the first delay time for both of the first edge (e.g., a rising edge) and the second edge (e.g., a falling edge) of the clock signal CLK.

In some example embodiments, the delay circuit 100 may be in each of paths of clock signals CLK of a multi-phase clock signal. In this case, the first inverting circuit 140 may be configured to adjust the first delay time for each clock signal CLK, such that the delay circuit 100 may correct a phase error (e.g., a quadrature error or a skew) in which the clock signals CLK of the multi-phase clock signal have an undesired phase difference.

The second signal generator 160 may be configured to generate a plurality of second switching signals SWS2 based on a duty code DUTY_CODE. In some example embodiments, the duty code DUTY_CODE may have M bits, and the second signal generator 160 may be configured to generate 2^M second switching signals SWS2, where M is an integer greater than 0.

The second inverting circuit 180 may be configured to invert the clock signal CLK that is output from the first inverting circuit 140. The second inverting circuit 180 may include a plurality of second inverters INV2 that are connected in parallel with each other. In some example embodiments, the second inverting circuit 160 may further include a fourth inverter INV4 that is connected in parallel with the plurality of second inverters INV2.

The plurality of second inverters INV2 may include a plurality of second pull-up units PU2 that are connected in parallel between the first power supply line and an output node of the second inverting circuit 180, and a plurality of second pull-down units PD2 that are connected in parallel between the output node and the second power supply line. Respective ones of the plurality of second pull-up units PU2 or respective ones of the plurality of second pull-down units PD2 may be selectively turned on in response to respective ones of the plurality of second switching signals SWS2. Because the plurality of second pull-up units PU2 or the plurality of second pull-down units PD2 is selectively turned on, the second inverting circuit 180 may be configured to adjust a second delay time for one or both of the first edge and the second edge of the clock signal CLK.

In some example embodiments, as illustrated in FIG. 1, respective ones of the plurality of second pull-down units PD2 of the plurality of second inverters INV2 may be selectively turned on in response to respective ones of the plurality of second switching signals SWS2, and the second inverting circuit 180 may be configured to adjust the second delay time for the second edge (e.g., the falling edge) of the clock signal CLK. For example, the second delay time for the second edge of the clock signal CLK may decrease as the number of the turned-on second pull-down units PD2 increases, and may increase as the number of the turned-on second pull-down units PD2 decreases.

In some example embodiments, in a case where the delay circuit 100 is in each of paths of the clock signals CLK of the multi-phase clock signal, the first inverting circuit 140 may be configured to adjust the second delay time for one of the first and second edges of each clock signal CLK, and/or may be configured to adjust a duty cycle (or a pulse width) of each clock signal CLK, such that the delay circuit 100 may correct a duty error in which each clock signal CLK of the multi-phase clock signal has an undesired duty cycle.

As described above, the delay circuit 100 according to example embodiments may be configured to adjust the first delay time for one or both of the first edge and the second edge of the clock signal CLK based on the delay code DLY_CODE, and may adjust the second delay time for one or both of the first edge and the second edge of the clock signal CLK based on the duty code DUTY_CODE. Accordingly, the delay circuit 100 may be used to correct one or both of the phase error and the duty error of the multi-phase clock signal.

Although FIG. 1 illustrates an example where the first inverting circuit 140 is configured to invert the clock signal CLK that is input to the delay circuit 100, and the second inverting circuit 180 is configured to invert the clock signal CLK that is output from the first inverting circuit 140, in other example embodiments, the second inverting circuit 180 may be configured to invert the clock signal CLK that is input to the delay circuit 100, and the first inverting circuit 140 may be configured to invert the clock signal CLK that is output from the first inverting circuit 140. In this case, the plurality of second pull-up units PU2 of the plurality of second inverters INV2 may be selectively turned on in response to the plurality of second switching signals SWS2, respectively.

Figure 2:
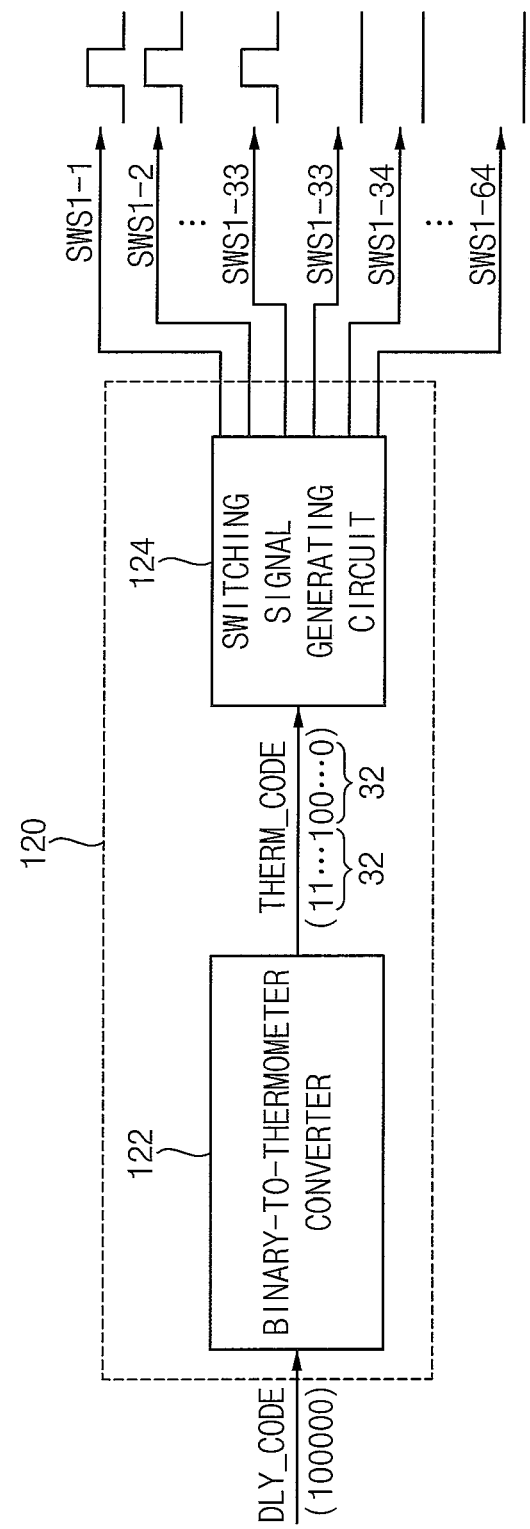
FIG. 2 is a block diagram illustrating an example of a first signal generator included in a delay circuit according to example embodiments of the inventive concept.

FIG. 2 is a block diagram illustrating an example of a first signal generator included in a delay circuit according to example embodiments of the inventive concept.

Referring to FIG. 2, a first signal generator 120 may include a first binary-to-thermometer converter 122 and a first switching signal generating circuit 124.

The first binary-to-thermometer converter 122 may be configured to convert a delay code DLY_CODE that is a binary code into a first thermometer code THERM_CODE. In some example embodiments, the delay code DLY_CODE may have N bits, and the first thermometer code THERM_CODE may have $2^N$ bits. For example, in a case where the delay code DLY_CODE has six bits having a value of '100000', the first binary-to-thermometer converter 122 may be configured to generate the first thermometer code THERM_CODE having thirty two bits each having a value of '1' and thirty two bits each having a value of '0'.

The first switching signal generating circuit 124 may be configured to generate a plurality of first switching signals SWS1-1 through SWS1-64 corresponding to the first thermometer code THERM_CODE. For example, in a case where the first thermometer code THERM_CODE has thirty two bits each having a value of '1' and thirty two bits each having a value of '0', the first switching signal generating circuit 124 may be configured to generate thirty two first switching signals SWS1-1, SWS1-2, . . . , SWS1-32 having an active level (e.g., a high level) and thirty two first switching signals SWS1-33, SWS1-34, . . . , SWS1-64 having an inactive level (e.g., a low level).

Figure 3:
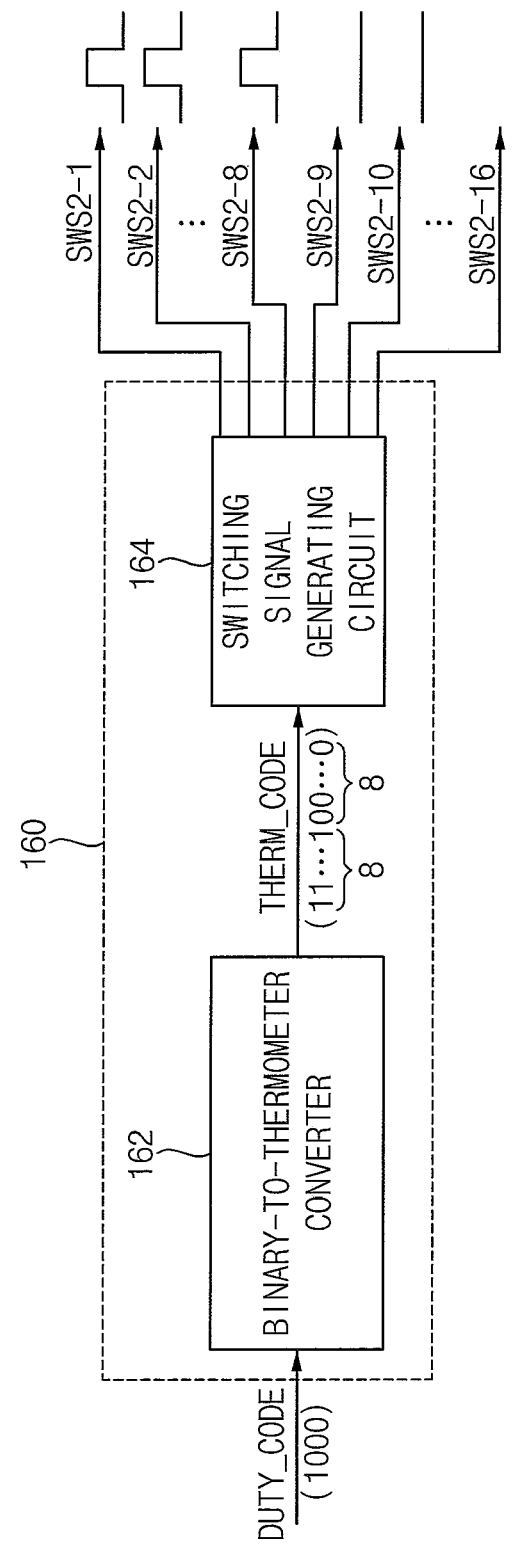
FIG. 3 is a block diagram illustrating an example of a second signal generator included in a delay circuit according to example embodiments of the inventive concept.

FIG. 3 is a block diagram illustrating an example of a second signal generator included in a delay circuit according to example embodiments of the inventive concept.

Referring to FIG. 3, a second signal generator 160 may include a second binary-to-thermometer converter 162 and a second switching signal generating circuit 164.

The second binary-to-thermometer converter 162 may be configured to convert a duty code DUTY_CODE that is a binary code into a second thermometer code THERM_CODE. In some example embodiments, the duty code DUTY_CODE may have M bits, and the second thermometer code THERM_CODE may have $2^M$ bits. For example, in a case where the duty code DUTY_CODE has four bits having a value of '1000', the second binary-to-thermometer converter 162 may be configured to generate the second thermometer code THERM_CODE having eight bits each having a value of '1' and eight bits each having a value of '0'.

The second switching signal generating circuit 164 may be configured to generate a plurality of second switching signals SWS2-1 through SWS2-16 corresponding to the second thermometer code THERM_CODE. For example, in a case where the second thermometer code THERM_CODE has eight bits each having a value of '1' and eight bits each having a value of '0', the second switching signal generating circuit 164 may be configured to generate eight second switching signals SWS2-1, SWS2-2, . . . , SWS2-8 having an active level (e.g., a high level) and eight second switching signals SWS2-9, SWS2-10, . . . , SWS2-16 having an inactive level (e.g., a low level).

Figure 4:
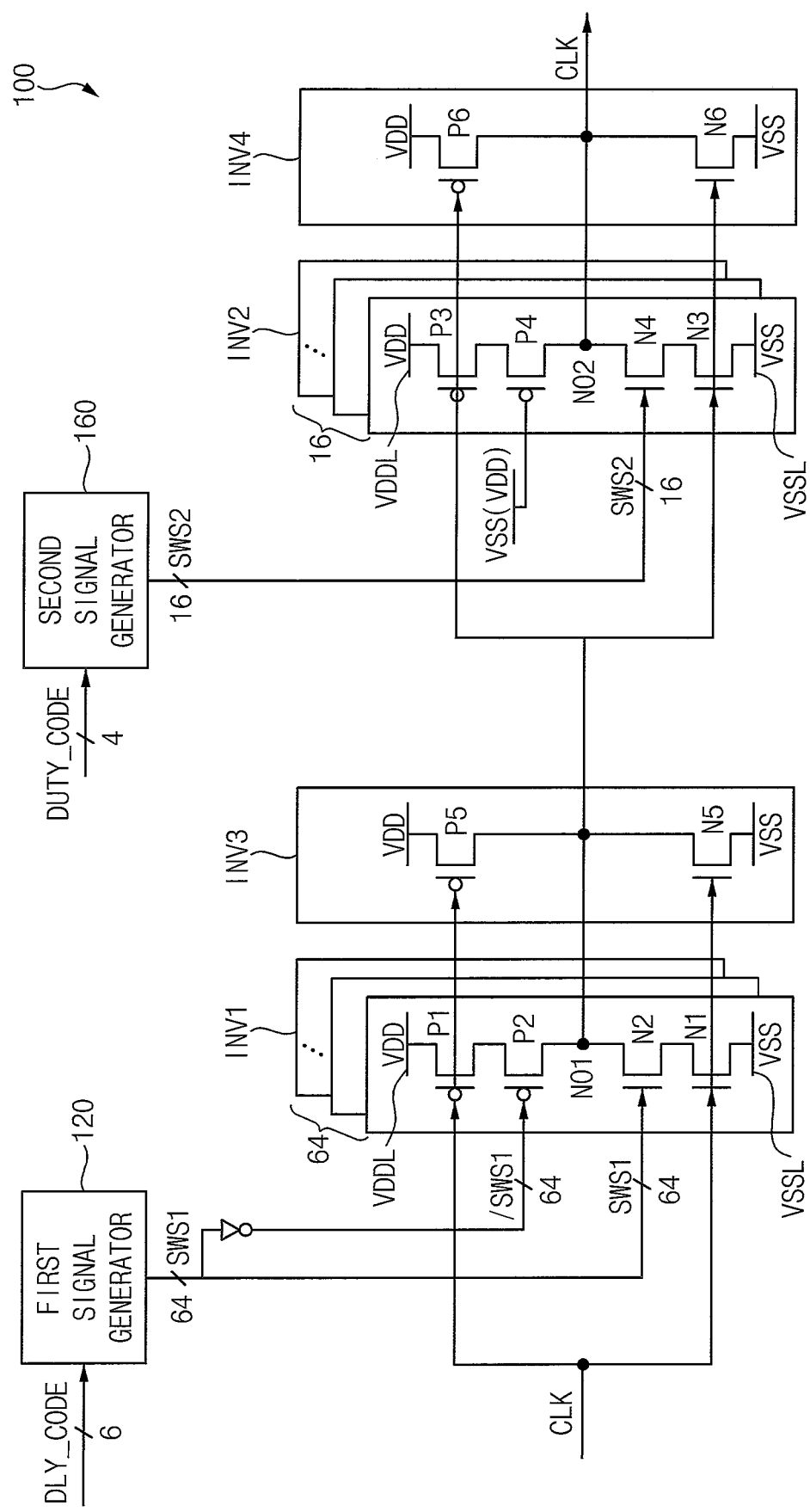
FIG. 4 is a diagram illustrating an example of a delay circuit according to example embodiments of the inventive concept.

FIG. 4 is a diagram illustrating an example of a delay circuit according to example embodiments of the inventive concept.

Referring to FIG. 4, a first inverting circuit of a delay circuit 100 may include a plurality of first inverters INV1 and a third inverter INV3 that are connected in parallel with each other, and a second inverting circuit of the delay circuit 100 may include a plurality of second inverters INV2 and a fourth inverter INV4 that are connected in parallel with each other. For example, as illustrated in FIG. 4, in a case where a delay code DLY_CODE has six bits, and a duty code DUTY_CODE has four bits, the delay circuit 100 may include sixty four first inverters INV1 and sixteen second inverters INV2.

Each first inverter INV1 may include a first pull-up unit and a first pull-down unit, and the first pull-up unit may include a first p-type metal-oxide-semiconductor (PMOS) transistor P1 receiving a clock signal CLK, and a second PMOS transistor P2 receiving a first inverted switching signal/SWS1. The second PMOS transistor P2 may be selectively turned on or off in response to the first inverted switching signal/SWS1, and thus the first pull-up unit may be selectively turned on or off. The first PMOS transistor P1 and the second PMOS transistor P2 may be connected in series between a first power supply line VDDL, which transfers a first power supply voltage VDD, and a first output node NO1 of the first inverting circuit. In some example embodiments, the first PMOS transistor P1 may include a gate that receives the clock signal CLK, a source connected to the first power supply line VDDL, and a drain connected to the second PMOS transistor P2, and the second PMOS transistor P2 may include a gate that receives the first inverted switching signal/SWS1, a source connected to the first PMOS transistor P1, and a drain connected to the first output node NO1.

Further, the first pull-down unit may include a first n-type metal-oxide-semiconductor (NMOS) transistor N1 that receives the clock signal CLK, and a second NMOS transistor N2 that receives a first switching signal SWS1. The second NMOS transistor N2 may be selectively turned on or off in response to the first switching signal SWS1, and thus the first pull-down unit may be selectively turned on or off. The first NMOS transistor N1 and the second NMOS transistor N2 may be connected in series between the first output node NO1 and a second power supply line VSSL, which transfers a second power supply voltage VSS. In some example embodiments, the first NMOS transistor N1 may include a gate that receives the clock signal CLK, a source connected to the second power supply line VSSL, and a drain connected to the second NMOS transistor N2, and the second NMOS transistor N2 may include a gate that receives the first switching signal SWS1, a source connected to the first NMOS transistor N1, and a drain connected to the first output node NO1.

The third inverter INV3 may include a fifth PMOS transistor P5 connected between the first power supply line VDDL and the first output node NO1, which receives the clock signal CLK, and a fifth NMOS transistor N5 connected between the first output node NO1 and the second power supply line VSSL, which receives the clock signal CLK. In some example embodiments, the fifth PMOS transistor P5 may include a gate that receives the clock signal CLK, a source connected to the first power supply line VDDL, and a drain connected to the first output node NO1, and the fifth NMOS transistor N5 may include a gate that receives the clock signal CLK, a source connected to the second power supply line VSSL, and a drain connected to the first output node NO1.

The sixty four first inverters INV1 may be selectively turned on in response to the first switching signals SWS1 generated based on the delay code DLY_CODE, and thus a first delay time for one or both of a rising edge and a falling edge of the clock signal CLK may be adjusted by the first inverting circuit. For example, in a case where the delay code DLY_CODE has a value of '000000', all of the sixty four first inverters INV1 may be turned off. In this case, the first inverting circuit may invert the clock signal CLK by using only the third inverter INV3, and the first delay time for the clock signal CLK may be a maximum delay time by the first inverting circuit. In another example, in a case where the delay code DLY_CODE has a value of '111111', all of the sixty four first inverters INV1 may be turned on. In this case, the first inverting circuit may invert the clock signal CLK by using the sixty four first inverters INV1 and the third inverter INV3 that are connected in parallel with each other, and the first delay time for the clock signal CLK may be a minimum delay time by the first inverting circuit. Thus, as the delay code DLY_CODE increases, the number of turned-on first inverters INV1 may be increased, and the first delay time for the clock signal CLK may be decreased.

Each second inverter INV2 may include a second pull-up unit and a second pull-down unit, and the second pull-up unit may include a third PMOS transistor P3 that receives the clock signal CLK, and a fourth PMOS transistor P4 that receives the second power supply voltage VSS (or the first power supply voltage VDD). The third PMOS transistor P3 and the fourth PMOS transistor P4 may be connected in series between the first power supply line VDDL and a second output node NO2 of the second inverting circuit. In some example embodiments, the third PMOS transistor P3 may include a gate that receives the clock signal CLK, a source connected to the first power supply line VDDL, and a drain connected to the fourth PMOS transistor P4, and the fourth PMOS transistor P4 may include a gate that receives the second power supply voltage VSS (or the first power supply voltage VDD), a source connected to the third PMOS transistor P3, and a drain connected to the second output node NO2.

The fourth PMOS transistor P4 that receives the second power supply voltage VSS may maintain a turn-on state, and the fourth PMOS transistor P4 that receives the first power supply voltage VDD may maintain a turn-off state. In some example embodiments, among the sixteen second inverters INV2, the fourth PMOS transistors P4 included in eight second inverters INV2 may receive the second power supply voltage VSS, and the fourth PMOS transistors P4 included in other eight second inverters INV2 may receive the first power supply voltage VDD. In this case, among sixteen second pull-up units of the sixteen second inverters INV2, eight second pull-up units may maintain the turn-on state, and other eight second pull-up units may maintain the turn-off state.

Further, the second pull-down unit may include a third NMOS transistor N3 that receives the clock signal CLK, and a fourth NMOS transistor N4 that receives a second switching signal SWS2. The fourth NMOS transistor N4 may be selectively turned on or off in response to the second switching signal SWS2, and thus the second pull-down unit may be selectively turned on or off. The third NMOS transistor N3 and the fourth NMOS transistor N4 may be connected in series between the second output node NO2 and the second power supply line VSSL. In some example embodiments, the third NMOS transistor N3 may include a gate that receives the clock signal CLK, a source connected to the second power supply line VSSL, and a drain connected to the fourth NMOS transistor N4, and the fourth NMOS transistor N4 may include a gate that receives the second switching signal SWS2, a source connected to the third NMOS transistor N3, and a drain connected to the second output node NO2.

The fourth inverter INV4 may include a sixth PMOS transistor P6 connected between the first power supply line VDDL and the second output node NO2, which receives the clock signal CLK, and a sixth NMOS transistor N6 connected between the second output node NO2 and the second power supply line VSSL, which receives the clock signal CLK. In some example embodiments, the sixth PMOS transistor P6 may include a gate that receives the clock signal CLK, a source connected to the first power supply line VDDL, and a drain connected to the second output node NO2, and the sixth NMOS transistor N6 may include a gate receiving the clock signal CLK, a source connected to the second power supply line VSSL, and a drain connected to the first output node NO2.

Sixteen second pull-down units of the sixteen second inverters INV2 may be selectively turned on in response to the second switching signals SWS2 generated based on the duty code DUTY_CODE, and thus a second delay time for the falling edge of the clock signal CLK may be adjusted by the second inverting circuit. In a case where the duty code DUTY_CODE is changed, the second inverting circuit may delay the rising edge of the clock signal CLK by a substantially constant delay time, and may delay the falling edge of the clock signal CLK by the second delay time corresponding to the changed duty code DUTY_CODE. Accordingly, a duty cycle (or a pulse width) of the clock signal CLK may be adjusted based on the duty code DUTY_CODE. For example, in a case where the duty code DUTY_CODE has a value of '0000', all of the sixteen second pull-down units may be turned off, and the second inverting circuit may output the falling edge of the clock signal CLK by using only the sixth NMOS transistor N6 of the fourth inverter INV4. In this case, the second delay time for the falling edge of the clock signal CLK may be a maximum delay time by the second inverting circuit, and the duty cycle (or the pulse width) of the clock signal CLK may be a maximum duty cycle. In another example, in a case where the duty code DUTY_CODE has a value of '1111', all of the sixteen second pull-down units may be turned on, and the second inverting circuit may output the falling edge of the clock signal CLK by using the sixteen second pull-down units and the sixth NMOS transistor N6 that are connected in parallel with each other. In this case, the second delay time for the falling edge of the clock signal CLK may be a minimum delay time by the second inverting circuit, and the duty cycle (or the pulse width) of the clock signal CLK may be a minimum duty cycle. Thus, as the duty code DUTY_CODE increases, the number of turned-on second pull-down units may be increased, the second delay time for the falling edge of the clock signal CLK may be decreased, and the duty cycle of the clock signal CLK may be decreased.

Figure 5:
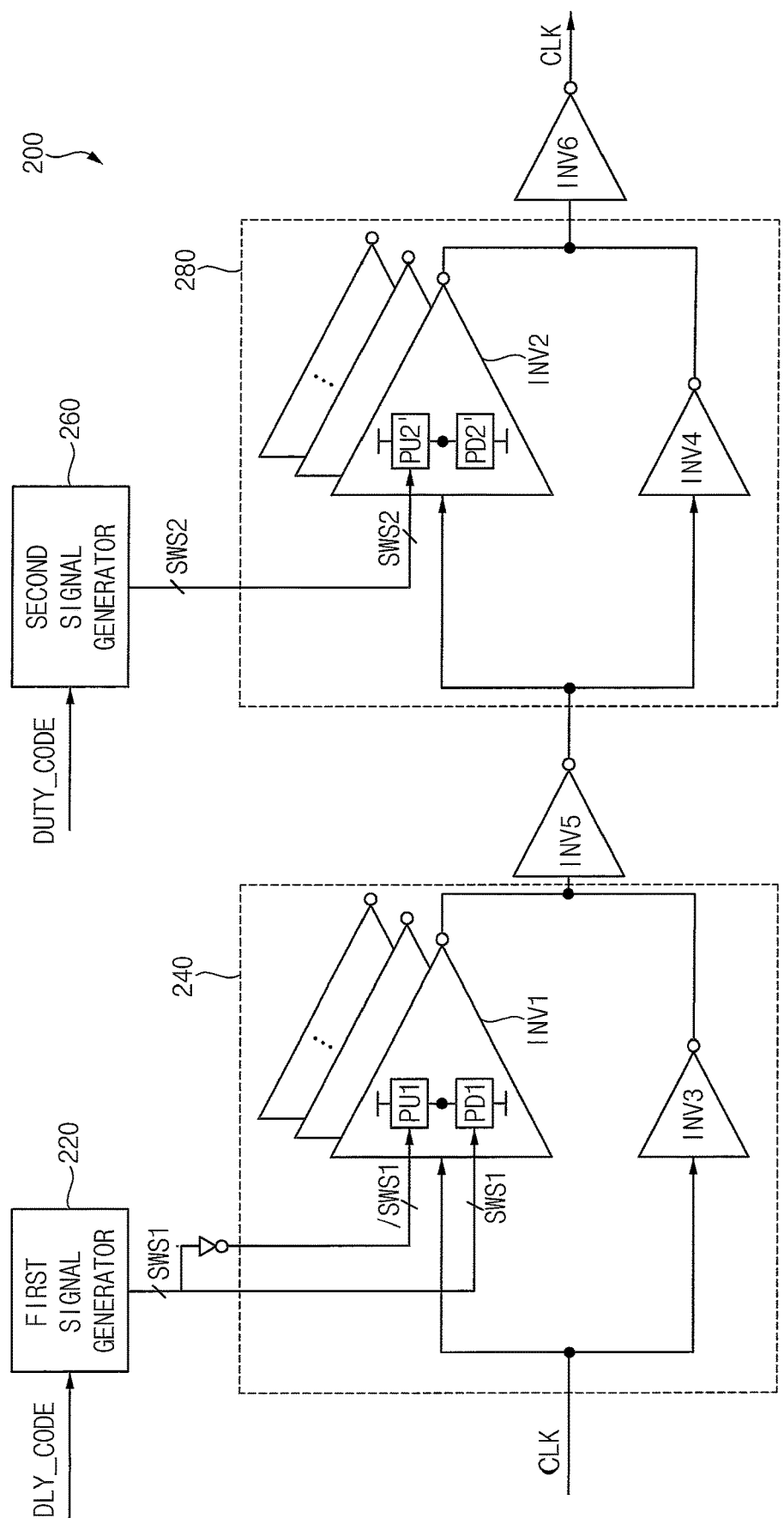
FIG. 5 is a block diagram illustrating a delay circuit according to example embodiments of the inventive concept.

FIG. 5 is a block diagram illustrating a delay circuit according to example embodiments of the inventive concept.

Referring to FIG. 5, a delay circuit 200 may include a first signal generator 220, a first inverting circuit 240, a fifth inverter INV5, a second signal generator 260, a second inverting circuit 280 and a sixth inverter INV6. The delay circuit 200 of FIG. 5 may have a similar configuration and a similar operation to a delay circuit 100 of FIG. 1, except that the delay circuit 200 may further include the fifth inverter INV5 and the sixth inverter INV6, and that a plurality of second pull-up units PU2' of a plurality of second inverters INV2 of the second inverting circuit 280 may be selectively turned on or off in response to a plurality of second switching signals SWS2.

The first inverting circuit 240 may be configured to invert a clock signal CLK input to the delay circuit 200, the fifth inverter INV5 may be configured to invert the clock signal CLK output from the first inverting circuit 240, the second inverting circuit 280 may be configured to invert the clock signal CLK output from the fifth inverter INV5, and the sixth inverter INV6 may be configured to invert the clock signal CLK output from the second inverting circuit 280.

The plurality of second inverters INV2 of the second inverting circuit 280 may include the plurality of second pull-up units PU2' and a plurality of second pull-down units PD2'. The plurality of second pull-up units PU2' may be selectively turned on in response to the second switching signals SWS2, respectively, and thus a delay time for a rising edge of the clock signal CLK output from the second inverting circuit 280. Because the clock signal CLK output from the second inverting circuit 280 is inverted by the sixth inverter INV6, a delay time for a falling edge of the clock signal CLK output by the delay circuit 200 may be adjusted according to the number of the turned-on second pull-up units PU2'.

Figure 6:
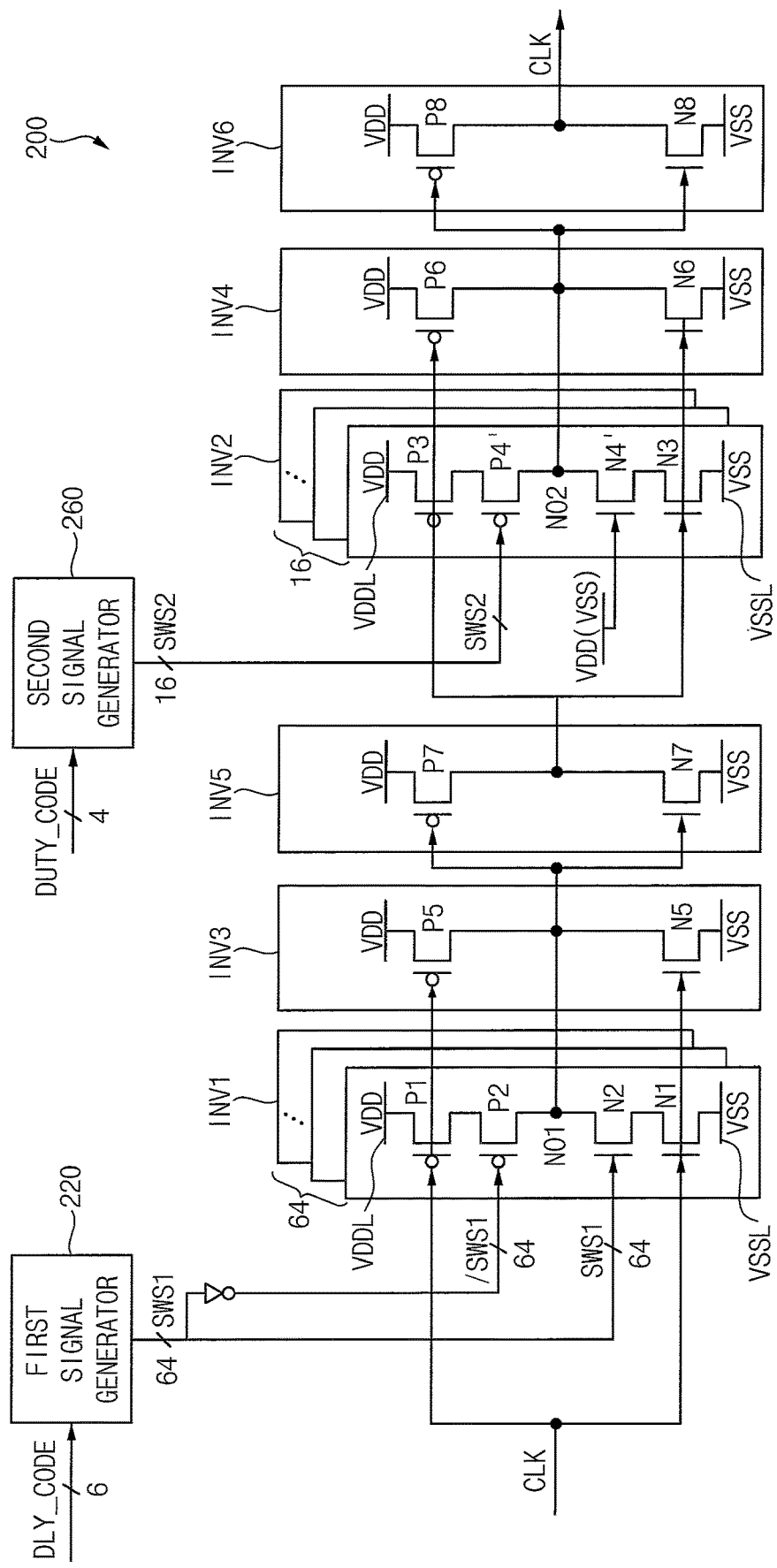
FIG. 6 is a diagram illustrating an example of a delay circuit according to example embodiments of the inventive concept.

FIG. 6 is a diagram illustrating an example of a delay circuit according to example embodiments of the inventive concept.

Referring to FIG. 5, compared with a delay circuit 200 illustrated in FIGS. 1 and 4, a delay circuit 200 may further include a fifth inverter INV5 and a sixth inverter INV6.

The fifth inverter INV5 may be configured to invert a clock signal CLK output from a first inverting circuit. The fifth inverter INV5 may include a seventh PMOS transistor P7 and a seventh NMOS transistor N7. In some example embodiments, the seventh PMOS transistor P7 may include a gate that receives the clock signal CLK output from the first inverting circuit, a source connected to a first power supply line VDDL, and a drain connected to an output node of the fifth inverter INV5, and the seventh NMOS transistor N7 may include a gate that receives the clock signal CLK output from the first inverting circuit, a source connected to a second power supply line VSSL, and a drain connected to the output node of the fifth inverter INV5.

The sixth inverter INV6 may be configured to invert a clock signal CLK output from a second inverting circuit. The sixth inverter INV6 may include an eighth PMOS transistor P8 and an eighth NMOS transistor N8. In some example embodiments, the eighth PMOS transistor P8 may include a gate that receives the clock signal CLK output from the second inverting circuit, a source connected to the first power supply line VDDL, and a drain connected to an output node of the delay circuit 200, and the eighth NMOS transistor N8 may include a gate that receives the clock signal CLK output from the second inverting circuit, a source connected to the second power supply line VSSL, and a drain connected to the output node of the delay circuit 200.

At least a portion of fourth NMOS transistors N4' of a plurality of second inverters INV2 may receive a first power supply voltage VDD, and another portion of the fourth NMOS transistors N4' of the plurality of second inverters INV2 may receive a second power supply voltage VSS. For example, among sixteen fourth NMOS transistors N4' of sixteen second inverters INV2, eight fourth NMOS transistors N4' may receive the first power supply voltage VDD, and may maintain a turn-on state. Further, the other eight fourth NMOS transistors N4' may receive the second power supply voltage VSS, and may maintain a turn-off state.

Fourth PMOS transistors P4' of the plurality of second inverters INV2 may receive a plurality of second switching signals SWS2. Thus, the fourth PMOS transistors P4' may be selectively turned on or off in response to the plurality of second switching signals SWS2 generated based on a duty code DUTY_CODE, respectively. Accordingly, a delay time for a rising edge of the clock signal CLK output from the second inverting circuit may be adjusted. Further, because the clock signal CLK output from the second inverting circuit is inverted by the sixth inverter INV6, a delay time for a falling edge of the clock signal CLK output by the delay circuit 200 may be adjusted according to the number of the turned-on fourth PMOS transistors P4'.

Figure 7:
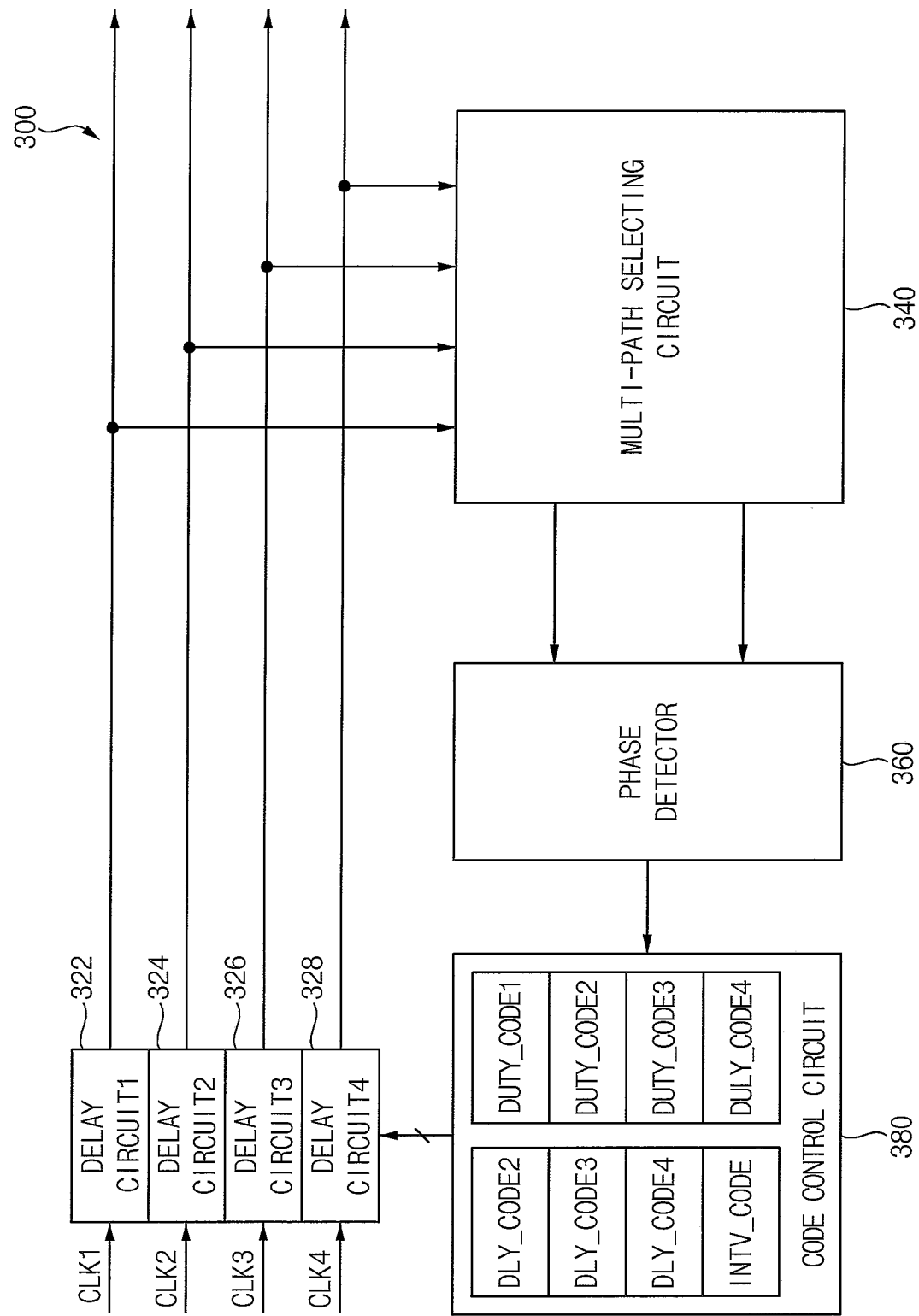
FIG. 7 is a block diagram illustrating a clock error correction device according to example embodiments of the inventive concept.
Figure 8:
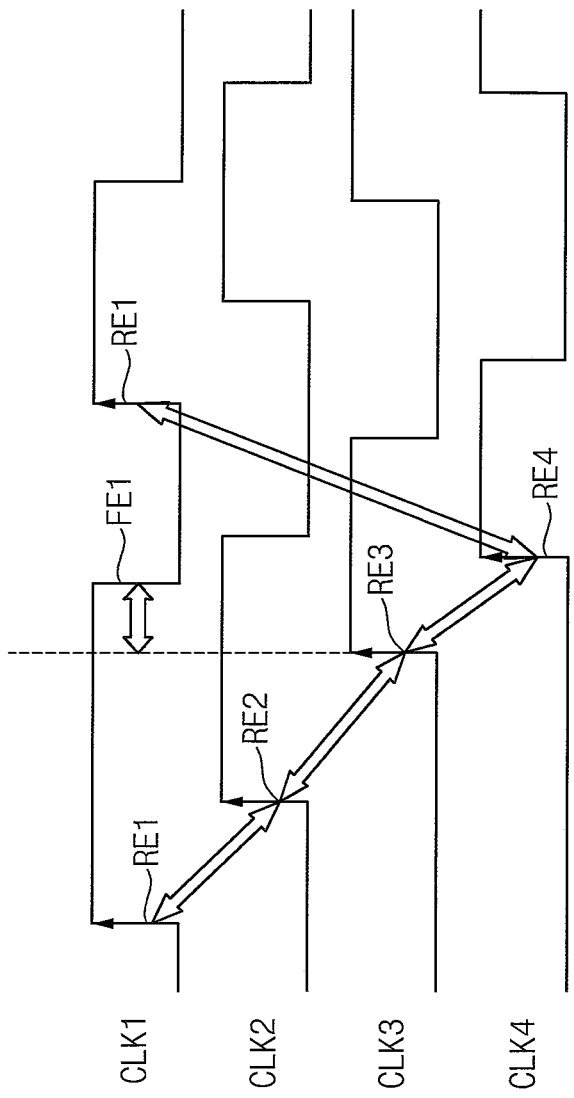
FIG. 8 is a timing diagram that illustrates an example of an operation of a clock error correction device according to example embodiments of the inventive concept.

FIG. 7 is a block diagram illustrating a clock error correction device according to example embodiments of the inventive concept, and FIG. 8 is a diagram for describing an example of an operation of a clock error correction device according to example embodiments of the inventive concept.

Referring to FIG. 7, a clock error correction device 300 may perform both of a phase correction operation and a duty correction operation for a plurality of clock signals CLK1, CLK2, CLK3 and CLK4 having different phases. In some example embodiments, the clock error correction device 300 may perform the phase and duty correction operations for a four-phase clock signal, or first, second, third and fourth clock signals CLK1, CLK2, CLK3 and CLK4 having a predetermined phase difference. For example, the first, second, third and fourth clock signals CLK1, CLK2, CLK3 and CLK4 may be the four-phase clock signal designed to have a phase difference of about 90 degrees, the first clock signal CLK1 may be an in-phase clock signal corresponding to a phase of about 0 degrees, the second clock signal CLK2 may be a quadrature clock signal corresponding to a phase of about 90 degrees, the third clock signal CLK3 may be a clock signal opposite to the in-phase clock signal and corresponding to a phase of about 180 degrees, and the fourth clock signal CLK4 may be a clock signal opposite to the quadrature clock signal and corresponding to a phase of about 270 degrees. The clock error correction device 300 may include a plurality of delay circuits 322, 324, 326 and 328, a multi-path selecting circuit 340, a phase detector 360 and a code control circuit 380.

The plurality of delay circuits 322, 324, 326 and 328 may be in paths of the plurality of clock signals CLK1, CLK2, CLK3 and CLK4, respectively. In some example embodiments, as illustrated in FIG. 7, a first delay circuit 322 may be in a path of the first clock signal CLK1, a second delay circuit 324 may be in a path of the second clock signal CLK2, a third delay circuit 326 may be in a path of the third clock signal CLK3, and a fourth delay circuit 322 may be in a path of the fourth clock signal CLK4. Each of the first, second, third and fourth delay circuits 322, 324, 326 and 328 may be implemented as a delay circuit 100 of FIG. 1, a delay circuit of FIG. 5, or the like.

The multi-path selecting circuit 340 may output two output signals that are selected from the plurality of clock signals CLK1, CLK2, CLK3 and CLK4. In a phase correction period in which the clock error correction device 300 performs the phase correction operation, the multi-path selecting circuit 340 may be configured to select two adjacent clock signals of the plurality of clock signals CLK1, CLK2, CLK3 and CLK4 output from the plurality of delay circuits 322, 324, 326 and 328, and may be configured to delay one of the two adjacent clock signals by a clock interval. Further, in a duty correction period in which the clock error correction device 300 performs the duty correction operation, the multi-path selecting circuit 340 may be configured to select two opposite clock signals of the plurality of clock signals CLK1, CLK2, CLK3 and CLK4 output from the plurality of delay circuits 322, 324, 326 and 328, and may be configured to invert one of the two opposite clock signals.

In some example embodiment, the phase correction operation may include a first sub-period, a second sub-period, a third sub-period and a fourth sub-period, and a correction period of the clock error correction device 300 may include the first sub-period of the phase correction operation, the second sub-period of the phase correction operation, the third sub-period of the phase correction operation, the fourth sub-period of the phase correction operation and the duty correction period. In the first sub-period of the phase correction operation, the multi-path selecting circuit 340 may be configured to select the first clock signal CLK1 and the second clock signal CLK2, and may be configured to delay the first clock signal CLK1 by the clock interval. Further, in the second sub-period of the phase correction operation, the multi-path selecting circuit 340 may be configured to select the second clock signal CLK2 and the third clock signal CLK3, and may be configured to delay the second clock signal CLK2 by the clock interval. Further, in the third sub-period of the phase correction operation, the multi-path selecting circuit 340 may be configured to select the third clock signal CLK3 and the fourth clock signal CLK4, and may be configured to delay the third clock signal CLK3 by the clock interval. Further, in the fourth sub-period of the phase correction operation, the multi-path selecting circuit 340 may be configured to select the fourth clock signal CLK4 and the first clock signal CLK1, and may be configured to delay the fourth clock signal CLK4 by the clock interval. The two opposite clock signals selected in the duty correction period may be changed in each correction period. For example, in the duty correction period of a first correction period, the multi-path selecting circuit 340 may be configured to select the first clock signal CLK1 and the third clock signal CLK3, and may be configured to output a first inverted clock signal and the third clock signal CLK3 by inverting the first clock signal CLK1. Further, in the duty correction period of a second correction period subsequent to the first correction period, the multi-path selecting circuit 340 may be configured to select the second clock signal CLK2 and the fourth clock signal CLK4, and may be configured to output a second inverted clock signal and the fourth clock signal CLK4 by inverting the second clock signal CLK2. Further, in the duty correction period of a third correction period subsequent to the second correction period, the multi-path selecting circuit 340 may be configured to select the third clock signal CLK3 and the first clock signal CLK1, and may be configured to output a third inverted clock signal and the first clock signal CLK1 by inverting the third clock signal CLK3. Further, in the duty correction period of a fourth correction period subsequent to the third correction period, the multi-path selecting circuit 340 may be configured to select the fourth clock signal CLK4 and the second clock signal CLK2, and may be configured to output a fourth inverted clock signal and the second clock signal CLK2 by inverting the fourth clock signal CLK4.

The phase detector 360 may be configured to compare phases of two clock signals output from the multi-path selecting circuit 340. In some example embodiments, the phase detector 360 may a bang-bang phase detector. The phase detector 360 may be configured to compare phases of the two adjacent clock signals output from the multi-path selecting circuit 340 in the phase correction period, and may be configured to compare phases of the two opposite clock signals output from the multi-path selecting circuit 340 in the duty correction period. In some example embodiments, the phase detector 360 may be configured to compare first edges (e.g., rising edges) of received two clock signals.

For example, the phase detector 360 may be configured to compare the first edge of the second clock signal CLK2 with the first edge of the first clock signal CLK1 delayed by the clock interval in the first sub-period of the phase correction period, may be configured to compare the first edge of the third clock signal CLK3 with the first edge of the second clock signal CLK2 delayed by the clock interval in the second sub-period of the phase correction period, may be configured to compare the first edge of the fourth clock signal CLK4 with the first edge of the third clock signal CLK3 delayed by the clock interval in the third sub-period of the phase correction period, and may be configured to compare the first edge of the first clock signal CLK1 with the first edge of the fourth clock signal CLK4 delayed by the clock interval in the fourth sub-period of the phase correction period. Further, the phase detector 360 may be configured to compare the first edge of the first inverted clock signal with the first edge of the third clock signal CLK3 in the duty correction period of the first correction period, may be configured to compare the first edge of the second inverted clock signal with the first edge of the fourth clock signal CLK4 in the duty correction period of the second correction period, may be configured to compare the first edge of the third inverted clock signal with the first edge of the first clock signal CLK1 in the duty correction period of the third correction period, and may be configured to compare the first edge of the fourth inverted clock signal with the first edge of the second clock signal CLK2 in the duty correction period of the fourth correction period.

The code control circuit 380 may be configured to store an interval code INTV_CODE for the clock interval, a plurality of delay codes DLY_CODE2, DLY_CODE3 and DLY_CODE4 and a plurality of duty codes DUTY_CODE1, DUTY_CODE2, DUTY_CODE3 and DUTY_CODE4. The interval code INTV_CODE may be used to adjust the clock interval that is used in the phase correction operation. In some example embodiments, the code control circuit 380 may be configured to store, as the plurality of delay codes DLY_CODE2, DLY_CODE3 and DLY_CODE4, a second delay code DLY_CODE2 for the second clock signal CLK2, a third delay code DLY_CODE3 for the third clock signal CLK3 and a fourth delay code DLY_CODE4 for the fourth clock signal CLK4. In some example embodiments, the code control circuit 380 may further include a first delay code for the first clock signal CLK1, and the first delay code may be set as a default delay code. Further, in some example embodiments, the code control circuit 380 may be configured to store, as the plurality of duty codes DUTY_CODE1, DUTY_CODE2, DUTY_CODE3 and DUTY_CODE4, a first duty code DUTY_CODE1 for the first clock signal CLK1, a second duty code DUTY_CODE2 for the second clock signal CLK2, a third duty code DUTY_CODE3 for the third clock signal CLK3, and a fourth duty code DUTY_CODE4 for the fourth clock signal CLK4.

The code control circuit 380 may be configured to adjust the interval code INTV_CODE and the plurality of delay codes DLY_CODE2, DLY_CODE3 and DLY_CODE4 in response to an output signal of the phase detector 360 in the phase correction period, and may be configured to adjust the plurality of duty codes DUTY_CODE1, DUTY_CODE2, DUTY_CODE3 and DUTY_CODE4 in response to the output signal of the phase detector 360 in the duty correction period. For example, the code control circuit 380 may be configured to adjust the second delay code DLY_CODE2 in response to the output signal of the phase detector 380 in the first sub-period of the phase correction period, may be configured to adjust the third delay code DLY_CODE3 in response to the output signal of the phase detector 380 in the second sub-period of the phase correction period, may be configured to adjust the fourth delay code DLY_CODE4 in response to the output signal of the phase detector 380 in the third sub-period of the phase correction period, and may be configured to adjust the interval code INTV_CODE in response to the output signal of the phase detector 380 in the fourth sub-period of the phase correction period. Further, the code control circuit 380 may be configured to adjust the first duty code DUTY_CODE1 in response to the output signal of the phase detector 380 in the duty correction period of the first correction period, may be configured to adjust the second duty code DUTY_CODE2 in response to the output signal of the phase detector 380 in the duty correction period of the second correction period, may be configured to adjust the third duty code DUTY_CODE3 in response to the output signal of the phase detector 380 in the duty correction period of the third correction period, and may be configured to adjust the fourth duty code DUTY_CODE4 in response to the output signal of the phase detector 380 in the duty correction period of the fourth correction period.

Each of the plurality of delay circuits 322, 324, 326 and 328 may be configured to adjust a first delay time for both of a first edge and a second edge of a corresponding clock signal of the plurality of clock signals CLK1, CLK2, CLK3 and CLK4 in response to a corresponding delay code of the plurality of delay codes DLY_CODE2, DLY_CODE3 and DLY_CODE4, and may be configured to adjust a second delay time for one of the first edge and the second edge of the corresponding clock signal in response to a corresponding duty code of the plurality of duty codes DUTY_CODE1, DUTY_CODE2, DUTY_CODE3 and DUTY_CODE4. The first delay circuit 322 may be configured to maintain the first delay time for the first clock signal CLK1 as a default delay time in response to the first delay code set as the default delay code, and may be configured to adjust the second delay time for a falling edge of the first clock signal CLK1 in response to the first duty code DUTY_CODE1. Further, the second delay circuit 324 may be configured to adjust the first delay time for the second clock signal CLK2 in response to the second delay code DLY_CODE2, and may be configured to adjust the second delay time for a falling edge of the second clock signal CLK2 in response to the second duty code DUTY_CODE2. Further, the third delay circuit 326 may be configured to adjust the first delay time for the third clock signal CLK3 in response to the third delay code DLY_CODE3, and may be configured to adjust the third delay time for a falling edge of the third clock signal CLK3 in response to the third duty code DUTY_CODE3. Further, the fourth delay circuit 328 may be configured to adjust the first delay time for the fourth clock signal CLK4 in response to the fourth delay code DLY_CODE4, and may be configured to adjust the second delay time for a falling edge of the fourth clock signal CLK4 in response to the fourth duty code DUTY_CODE4.

Further, the multi-path selecting circuit 340 may be configured to adjust the clock interval in response to the interval code INTV_CODE. For example, the multi-path selecting circuit 340 may decrease the clock interval as the interval code INTV_CODE increases, and may increase the clock interval as the interval code INTV_CODE decreases.

Phase errors and duty errors of the plurality of clock signals CLK1, CLK2, CLK3 and CLK4 may be corrected by the above-described operations. For example, as illustrated in FIG. 8, the first delay time for the second clock signal CLK2 may be adjusted in the first sub-period of the phase correction period such that the rising edge RE1 of the first clock signal CLK1 and the rising edge RE2 of the second clock signal CLK2 have the clock interval delay, the first delay time for the third clock signal CLK3 may be adjusted in the second sub-period of the phase correction period such that the rising edge RE2 of the second clock signal CLK2 and the rising edge RE3 of the third clock signal CLK3 have the clock interval delay, the first delay time for the fourth clock signal CLK4 may be adjusted in the third sub-period of the phase correction period such that the rising edge RE3 of the third clock signal CLK3 and the rising edge RE4 of the fourth clock signal CLK4 have the clock interval delay, and the clock interval may be adjusted in the fourth sub-period of the phase correction period such that the rising edge RE4 of the fourth clock signal CLK4 and the rising edge RE1 of the first clock signal CLK1 have the clock interval delay. By this phase correction operation in the phase correction period, the first, second, third and fourth clock signals CLK1, CLK2, CLK3 and CLK4 may have a desired phase difference (e.g., a phase difference of about 90 degrees), and the phase error between the first, second, third and fourth clock signals CLK1, CLK2, CLK3 and CLK4 may be corrected. Further, in each duty correction period, the second delay time for the falling edge (e.g., FE1) of one clock signal (e.g., CLK1) may be adjusted by comparing the falling edge (e.g., FE1) of the one clock signal (e.g., CLK1) and the rising edge (e.g., RE3) of a clock signal (e.g., CLK3) opposite to the one clock signal, and thus a duty cycle of the one clock signal (e.g., CLK1) may be adjusted. Thus, the second delay times for the falling edges of the first, second, third and fourth clock signals CLK1, CLK2, CLK3 and CLK4 may be adjusted in four duty correction periods of four correction periods, and thus duty cycles of the first, second, third and fourth clock signals CLK1, CLK2, CLK3 and CLK4 may be adjusted. By this duty correction operation in the duty correction periods, each of the first, second, third and fourth clock signals CLK1, CLK2, CLK3 and CLK4 may have a desired duty cycle, and the duty error of each of the first, second, third and fourth clock signals CLK1, CLK2, CLK3 and CLK4 may be corrected.

Figure 9:
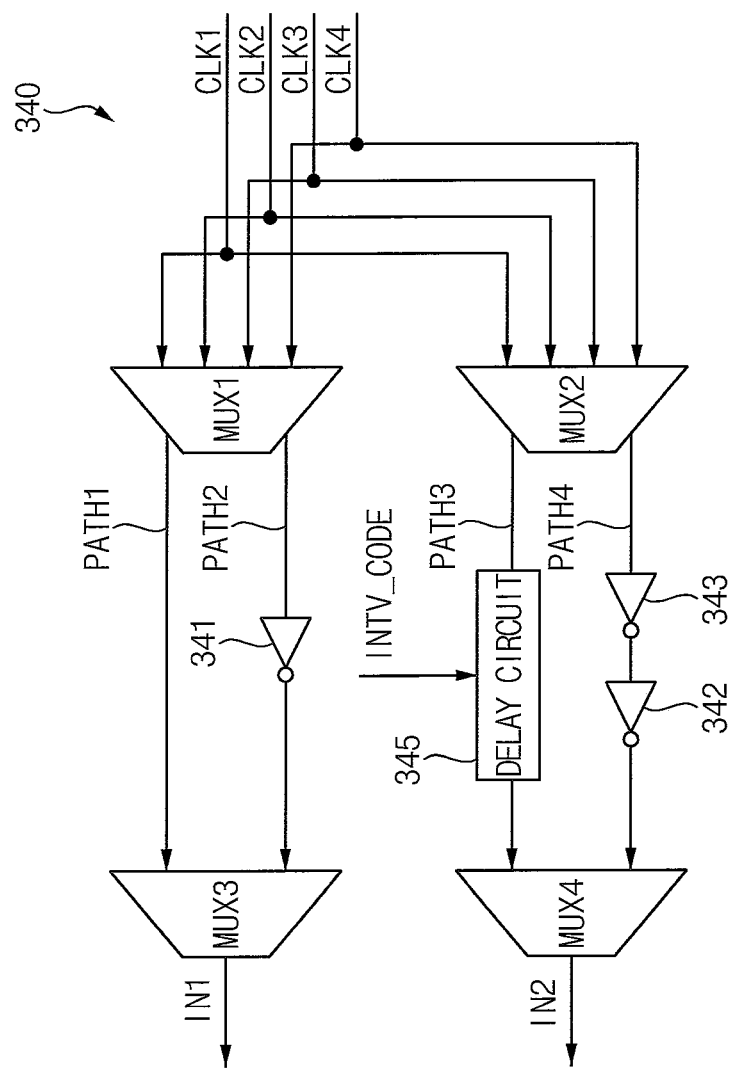
FIG. 9 is a block diagram illustrating an example of a multi-phase selecting circuit included in a clock error correction device according to example embodiments of the inventive concept.

FIG. 9 is a block diagram illustrating an example of a multi-phase selecting circuit included in a clock error correction device according to example embodiments of the inventive concept.

Referring to FIG. 9, a multi-path selecting circuit 340 may include a first path PATH1, a second path PATH2, a third path PATH3, a fourth path PATH4, a first multiplexer MUX1, a second multiplexer MUX2, a third multiplexer MUX3 and a fourth multiplexer MUX4.

The first path PATH1 may have no component (e.g., no active component). The second path PATH2 may include a first inverter 341. The first inverter 341 may be configured to invert an input signal, and may have a third delay time. The third path PATH3 may include a delay circuit 345. The delay circuit 345 may perform a delay operation that delays an input signal by a clock interval in response to an interval code INTV_CODE. The fourth path PATH4 may include second and third inverters 342 and 343 that are connected in series. A set of the second and third inverters 342 and 343 may have the third delay time that is substantially the same as the delay time of the first inverter 341.

The first multiplexer MUX1 may provide one of first through fourth clock signals CLK1 through CLK4 to the first path PATH1 in a phase correction period, and may provide one of the first through fourth clock signals CLK1 through CLK4 to the second path PATH2 in a duty correction period. For example, the first multiplexer MUX1 may provide the second clock signal CLK2 to the first path PATH1 in a first sub-period of the phase correction period, may provide the third clock signal CLK3 to the first path PATH1 in a second sub-period of the phase correction period, may provide the fourth clock signal CLK4 to the first path PATH1 in a third sub-period of the phase correction period, and may provide the first clock signal CLK1 to the first path PATH1 in a fourth sub-period of the phase correction period. Further, the first multiplexer MUX1 may provide the first clock signal CLK1 to the second path PATH2 in the duty correction period of a first correction period, may provide the second clock signal CLK2 to the second path PATH2 in the duty correction period of a second correction period, may provide the third clock signal CLK3 to the second path PATH2 in the duty correction period of a third correction period, and may provide the fourth clock signal CLK4 to the second path PATH2 in the duty correction period of a fourth correction period.

The second multiplexer MUX2 may provide one of the first through fourth clock signals CLK1 through CLK4 to the third path PATH3 in the phase correction period, and may provide one of the first through fourth clock signals CLK1 through CLK4 to the fourth path PATH4 in the duty correction period. For example, the second multiplexer MUX2 may provide the first clock signal CLK1 to the third path PATH3 in the first sub-period of the phase correction period, may provide the second clock signal CLK2 to the third path PATH3 in the second sub-period of the phase correction period, may provide the third clock signal CLK3 to the third path PATH3 in the third sub-period of the phase correction period, and may provide the fourth clock signal CLK4 to the third path PATH3 in the fourth sub-period of the phase correction period. Further, the second multiplexer MUX2 may provide the third clock signal CLK3 to the fourth path PATH4 in the duty correction period of the first correction period, may provide the fourth clock signal CLK4 to the fourth path PATH4 in the duty correction period of the second correction period, may provide the first clock signal CLK1 to the fourth path PATH4 in the duty correction period of the third correction period, and may provide the second clock signal CLK2 to the fourth path PATH4 in the duty correction period of the fourth correction period.

The third multiplexer MUX3 may provide a signal output from the first path PATH1 to a phase detector as a first input signal IN1 of the phase detector in the phase correction period, and may provide a signal output from the second path PATH2 to the phase detector as the first input signal IN1 of the phase detector in the duty correction period. Further, the fourth multiplexer MUX4 may provide a signal output from the third path PATH3 to the phase detector as a second input signal IN2 of the phase detector in the phase correction period, and may provide a signal output from the fourth path PATH4 to the phase detector as the second input signal IN2 of the phase detector in the duty correction period.

Figure 10:
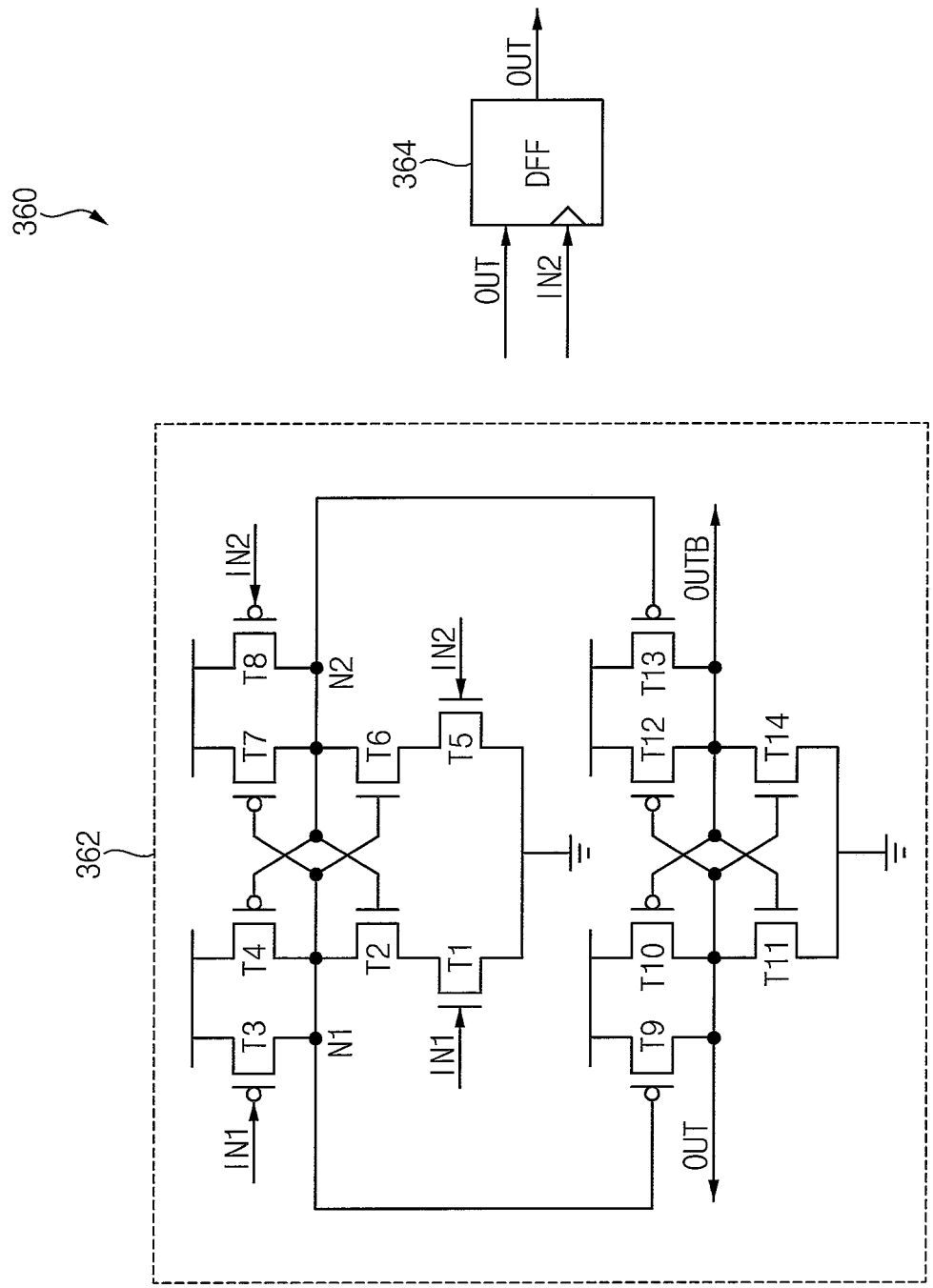
FIG. 10 is a diagram illustrating an example of a phase detector included in a clock error correction device according to example embodiments of the inventive concept.

FIG. 10 is a diagram illustrating an example of a phase detector included in a clock error correction device according to example embodiments of the inventive concept.

Referring to FIG. 10, a phase detector 360 may include a comparison circuit 362 and a flip-flop 364.

The comparison circuit 362 may be configured to generate an output signal OUT by comparing a rising edge of a first input signal IN1 received from a multi-path selecting circuit and a rising edge of a second input signal IN2 received from the multi-path selecting circuit. In some example embodiments, the comparison circuit 362 may include first through fourteenth transistors T1 through T14. In a case where the rising edge of the first input signal IN1 leads the rising edge of the second input signal IN2, a voltage of a first node N1 may transition to a low level by turned-on first and second transistors T1 and T2, and a voltage of a second node N2 may transition to a high level by turned-on seventh and eighth transistors T7 and T8. Further, due to turned-on ninth, tenth and fourteenth transistors T9, T10 and T14, the output signal OUT may transition to a high level, and an inverted output signal OUTB may transition to a low level. Further, in a case where the rising edge of the second input signal IN2 leads the rising edge of the first input signal IN1, the voltage of the second node N2 may transition to a low level by turned-on fifth and sixth transistors T5 and T6, and the voltage of the first node N1 may transition to a high level by turned-on third and fourth transistors T3 and T4. Further, due to turned-on eleventh, twelfth and thirteenth transistors T11, T12 and T13, the output signal OUT may transition to a low level, and the inverted output signal OUTB may transition to a high level.

The flip-flop 364 may be configured to capture and output the output signal OUT of the comparison circuit 362 at a falling edge of the second input signal IN2. Thus, in a case where the rising edge of the first input signal IN1 leads the rising edge of the second input signal IN2, the phase detector 360 may be configured to output the output signal OUT having a high level at the falling edge of the second input signal IN2. Further, in a case where the rising edge of the first input signal IN1 lags the rising edge of the second input signal IN2, the phase detector 360 may be configured to output the output signal OUT having a low level at the falling edge of the second input signal IN2. In some example embodiments, the flip-flop 364 may be a D flip-flop DFF.

Figure 11:
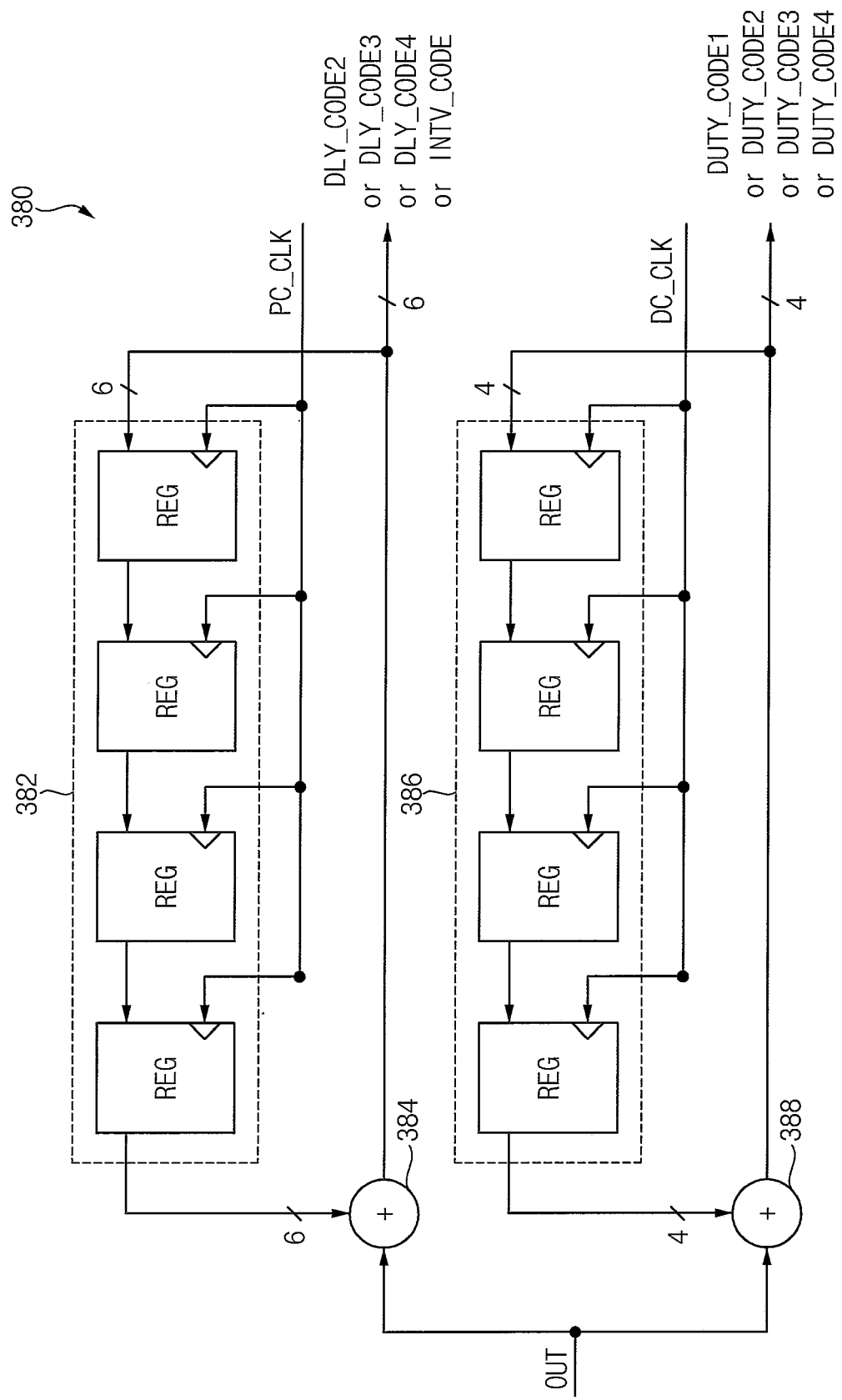
FIG. 11 is a block diagram illustrating an example of a code control circuit included in a clock error correction device according to example embodiments of the inventive concept.

FIG. 11 is a block diagram illustrating an example of a code control circuit included in a clock error correction device according to example embodiments of the inventive concept.

Referring to FIG. 11, a code control circuit 380 may include a first shift register 382, a first adder 384, a second shift register 386 and a second adder 388.

The first shift register 382 may be configured to store a plurality of delay codes DLY_CODE2, DLY_CODE3 and DLY_CODE4 and an interval code INTV_CODE, and may be configured to shift the plurality of delay codes DLY_CODE2, DLY_CODE3 and DLY_CODE4 and the interval code INTV_CODE in response to a phase correction clock signal PC_CLK. The first shift register 382 may include a plurality of registers REG. The first adder 384 may be configured to add an output signal OUT of a phase detector to a code output from the first shift register 382.

The second shift register 386 may be configured to store a plurality of duty codes DUTY_CODE1, DUTY_CODE2, DUTY_CODE3 and DUTY_CODE4, and may be configured to shift the plurality of duty codes DUTY_CODE1, DUTY_CODE2, DUTY_CODE3 and DUTY_CODE4 in response to a duty correction clock signal DC_CLK. The second shift register 386 may include a plurality of registers REG. The second adder 388 may be configured to add the output signal OUT of the phase detector to a code output from the second shift register 386.

Figure 12:
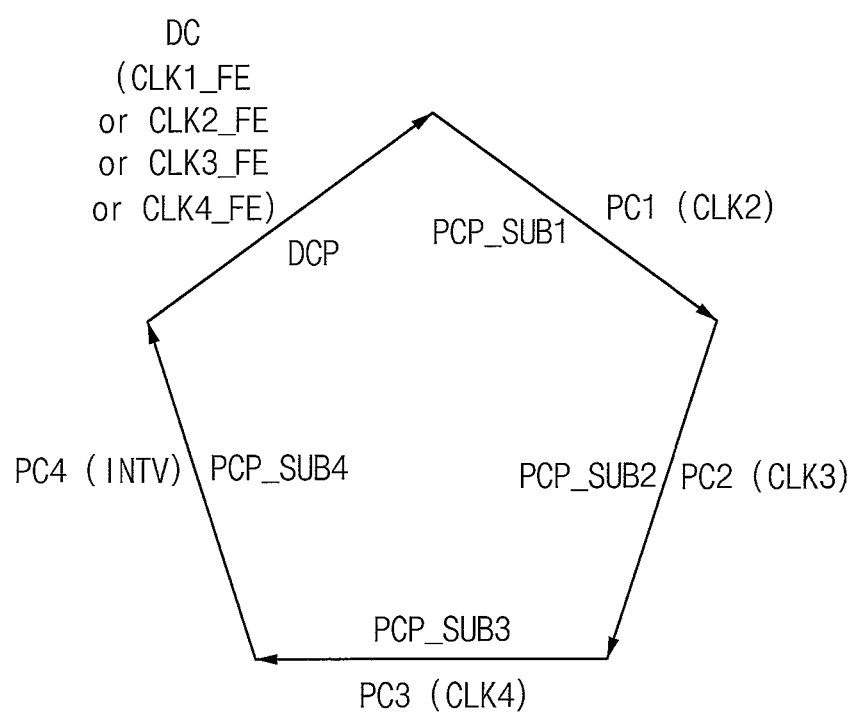
FIG. 12 is a diagram that illustrates an example of a correction loop of a clock error correction device according to example embodiments of the inventive concept.
Figure 13:
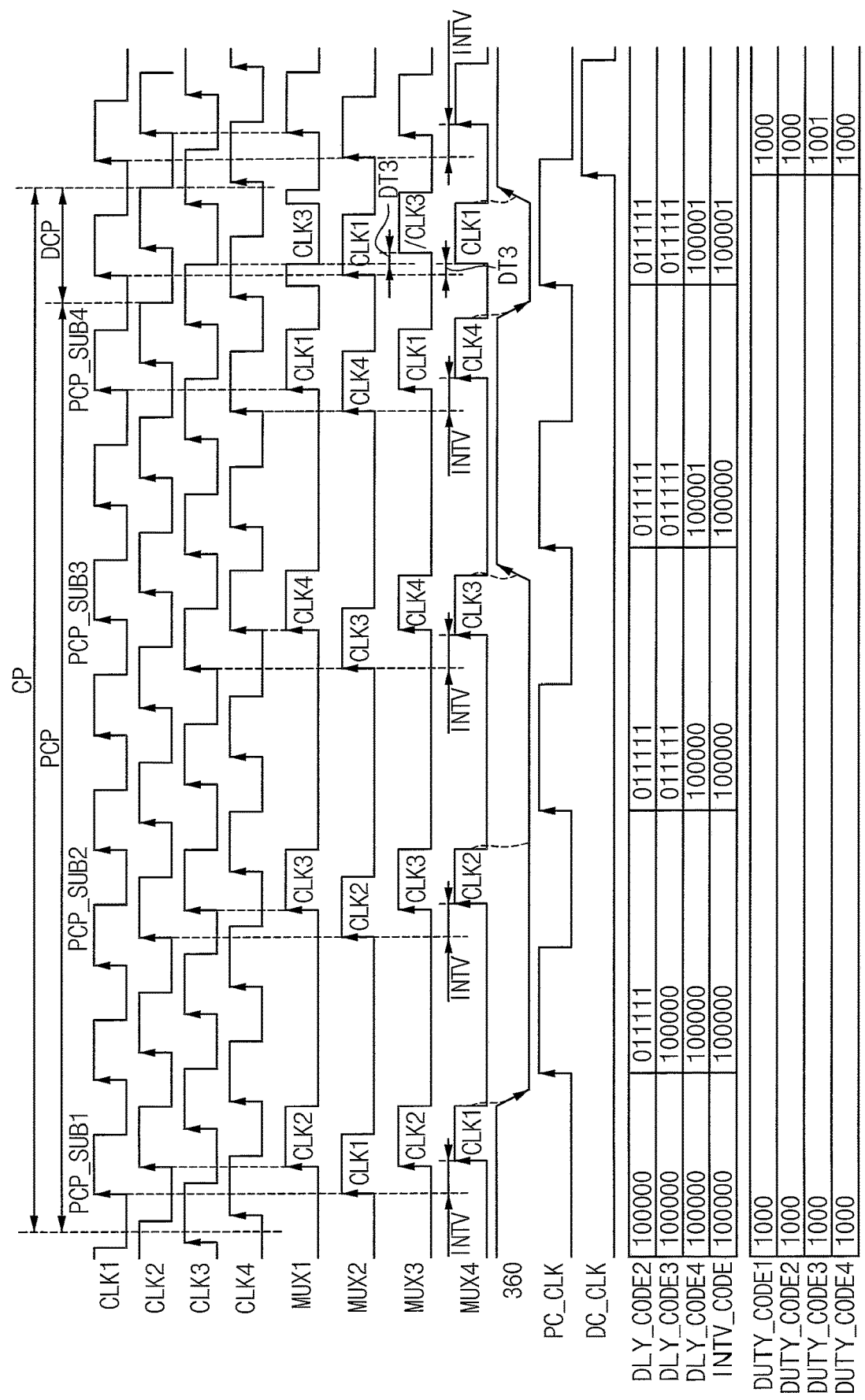
FIG. 13 is a timing diagram that illustrates an example of an operation of a clock error correction device according to example embodiments of the inventive concept.

FIG. 12 is a diagram that illustrates an example of a correction loop of a clock error correction device according to example embodiments of the inventive concept, and FIG.

13 is a timing diagram that illustrates an example of an operation of a clock error correction device according to example embodiments of the inventive concept.

Referring to FIGS. 7, 9, 12 and 13, a correction period CP of a clock error correction device 300 may include a first sub-period PCP_SUB1 of a phase correction period PCP, a second sub-period PCP_SUB2 of the phase correction period PCP, a third sub-period PCP_SUB3 of the phase correction period PCP, a fourth sub-period PCP_SUB4 of the phase correction period PCP and a duty correction period DCP. Further, a correction loop corresponding to the correction period CP may include a first phase correction operation PC1 for a second clock signal CLK2 in the first sub-period PCP_SUB1 of the phase correction period PCP, a second phase correction operation PC2 for a third clock signal CLK3 in the second sub-period PCP_SUB2 of the phase correction period PCP, a third phase correction operation PC3 for a fourth clock signal CLK4 in the third sub-period PCP_SUB3 of the phase correction period PCP, a fourth phase correction operation PC4 for a clock interval INTV in the fourth sub-period PCP_SUB4 of the phase correction period PCP, and a duty correction operation DC for a falling edge CLK1_FE, CLK2_FE, CLK3_FE or CLK4_FE of each clock signal in the duty correction period DCP. The clock signal on which the duty correction operation DC is performed in the duty correction period DCP may be changed in each correction period CP.

In the first sub-period PCP_SUB1 of the phase correction period PCP, a first multiplexer MUX1 may output the second clock signal CLK2 to a first path PATH1, and a second multiplexer MUX2 may output a first clock signal CLK1 to a third path PATH3. The third path PATH3 may delay the first clock signal CLK1 by the clock interval INTV. A third multiplexer MUX3 may output the second clock signal CLK2 of the first path PATH1 to a phase detector 360, and a fourth multiplexer MUX4 may output the first clock signal CLK1 of the third path PATH3 delayed by the clock interval INTV to the phase detector 360. The phase detector 360 may compare a rising edge of the second clock signal CLK2 with a rising edge of the first clock signal CLK1 delayed by the clock interval INTV. In a case where the rising edge of the second clock signal CLK2 leads the rising edge of the first clock signal CLK1 delayed by the clock interval INTV, the phase detector 360 may output an output signal having a low level at a falling edge of the first clock signal CLK1 delayed by the clock interval INTV. A code control circuit 380 may decrease a second delay code DLY_CODE2 by 1 in response to the output signal having the low level and a phase correction clock signal PC_CLK. A second delay circuit 324 may increase a first delay time for the second clock signal CLK2 in response to the second delay code DLY_CODE2 decreased by 1. Accordingly, the first phase correction operation PC1 that corrects a phase error of the second clock signal CLK2 may be performed. In this manner, the second phase correction operation PC2 that corrects a phase error of the third clock signal CLK3 may be performed in the second sub-period PCP_SUB2 of the phase correction period PCP, and the third phase correction operation PC3 that corrects a phase error of the fourth clock signal CLK4 may be performed in the third sub-period PCP_SUB3 of the phase correction period PCP.

In the fourth sub-period PCP_SUB4 of the phase correction period PCP, the phase detector 360 may compare a rising edge of the first clock signal CLK1 with a rising edge of the fourth clock signal CLK4 delayed by the clock interval INTV. In a case where the rising edge of the first clock signal CLK1 leads the rising edge of the fourth clock signal CLK4 delayed by the clock interval INTV, the phase detector 360 may output the output signal having the low level at a falling edge of the fourth clock signal CLK4 delayed by the clock interval INTV. The code control circuit 380 may increase an interval code INTV_CODE by 1 in response to the output signal having the low level and the phase correction clock signal PC_CLK. A delay circuit 345 of a third path PATH3 may decrease the clock interval INTV in response to the interval code INTV_CODE increased by 1. Accordingly, the fourth phase correction operation PC4 for the clock interval INTV may be performed. These first through fourth phase correction operations PC1 through PC4 may be repeated. Thus, the first through fourth clock signals CLK1 through CLK4 may have the clock interval INTV corresponding to about a quarter of a period of the first clock signal CLK1, and may have a desired phase difference.

The duty correction period DCP may be between a current phase correction period PCP and the next phase correction period PCP. In an example of FIG. 13, in the duty correction period DCP, the first multiplexer MUX1 may output the third clock signal CLK3 to a second path PATH2, and the second multiplexer MUX2 may output the first clock signal CLK1 to a fourth path PATH4. A first inverter 341 of the second path PATH2 may generate a third inverted clock signal/CLK3 by inverting the third clock signal CLK3, and may delay the third inverted clock signal/CLK3 by a third delay time DT3. Second and third inverters 342 and 343 of the fourth path PATH4 may delay the first clock signal CLK1 by the third delay time DT3. The third multiplexer MUX3 may output the third inverted clock signal/CLK3 of the second path PATH2 to the phase detector 360, and the fourth multiplexer MUX4 may output the first clock signal CLK1 of the fourth path PATH4 to the phase detector 360. The phase detector 360 may compare a rising edge of the third inverted clock signal/CLK3 with a rising edge of the first clock signal CLK1. In a case where the rising edge of the third inverted clock signal/CLK3 lags the rising edge of the first clock signal CLK1, the phase detector 360 may output the output signal having a high level at a falling edge of the first clock signal CLK1. The code control circuit 380 may increase a third duty code DUTY_CODE3 by 1 in response to the output signal having the high level and a duty correction clock signal DC_CLK. A third delay circuit 326 may decrease a second delay time for a falling edge of the third clock signal CLK3 in response to the third duty code DUTY_CODE3 increased by 1. Accordingly, a duty cycle of the third clock signal CLK3 may be decreased, and the duty correction operation DC that corrects a duty error of the third clock signal CLK3 may be performed. Duty cycle errors of the first through fourth clock signals CLK1 through CLK4 may be corrected in four duty cycle correction periods DCP of four correction periods CP, respectively.

Figure 14:
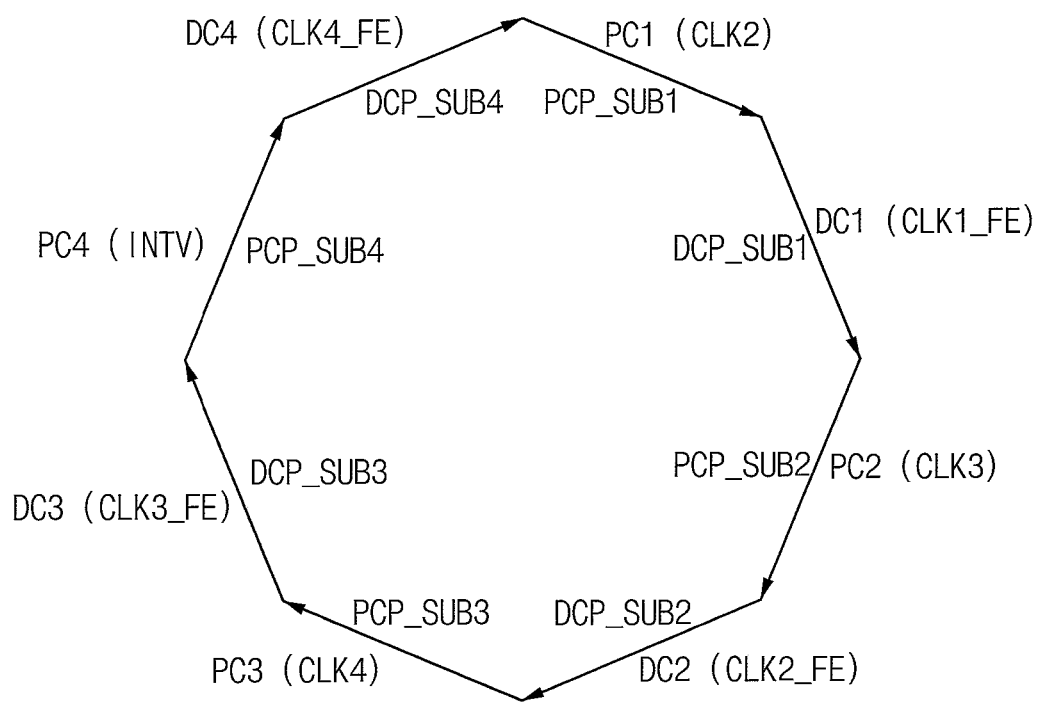
FIG. 14 is a diagram that illustrates another example of a correction loop of a clock error correction device according to example embodiments of the inventive concept.

FIG. 14 is a diagram that illustrates another example of a correction loop of a clock error correction device according to example embodiments of the inventive concept.

Referring to FIGS. 7 and 14, a correction period of a clock error correction device 300 may include a first sub-period PCP_SUB1 of a phase correction period PCP, a first sub-period DCP_SUB1 of a duty correction period DCP, a second sub-period PCP_SUB2 of the phase correction period PCP, a second sub-period DCP_SUB2 of the duty correction period DCP, a third sub-period PCP_SUB3 of the phase correction period PCP, a third sub-period DCP_SUB3 of the duty correction period DCP, a fourth sub-period PCP_SUB4 of the phase correction period PCP and a fourth sub-period PCP_SUB4 of the duty correction period DCP.

Further, a correction loop corresponding to the correction period may include a first phase correction operation PC1 in the first sub-period PCP_SUB1 of the phase correction period PCP, a first duty correction operation DC1 in the first sub-period DCP_SUB1 of the duty correction period DCP, a second phase correction operation PC2 in the second sub-period PCP_SUB2 of the phase correction period PCP, a second duty correction operation DC2 in the second sub-period DCP_SUB2 of the duty correction period DCP, a third phase correction operation PC3 in the third sub-period PCP_SUB3 of the phase correction period PCP, a third duty correction operation DC3 in the third sub-period DCP_SUB3 of the duty correction period DCP, a fourth phase correction operation PC4 in the fourth sub-period PCP_SUB4 of the phase correction period PCP, and a fourth duty correction operation DC4 in the fourth sub-period DCP_SUB4 of the duty correction period DCP.

For example, the first phase correction operation PC1 in the first sub-period PCP_SUB1 of the phase correction period PCP may adjust a first delay time for a second clock signal CLK2, such that a rising edge of a first clock signal CLK1 and a rising edge of the second clock signal CLK2 has a clock interval INTV delay. The first duty correction operation DC1 in the first sub-period DCP_SUB1 of the duty correction period DCP may adjust a second delay time for a falling edge CLK1_FE of the first clock signal CLK1 by comparing the falling edge CLK1_FE of the first clock signal CLK1 with a rising edge of a third clock signal CLK3. The second phase correction operation PC2 in the second sub-period PCP_SUB2 of the phase correction period PCP may adjust a first delay time for the third clock signal CLK3, such that the rising edge of the second clock signal CLK2 and the rising edge of the third clock signal CLK3 has the clock interval INTV delay. The second duty correction operation DC2 in the second sub-period DCP_SUB2 of the duty correction period DCP may adjust a second delay time for a falling edge CLK2_FE of the second clock signal CLK2 by comparing the falling edge CLK2_FE of the second clock signal CLK2 with a rising edge of a fourth clock signal CLK4. The third phase correction operation PC3 in the third sub-period PCP_SUB3 of the phase correction period PCP may adjust a first delay time for the fourth clock signal CLK4, such that the rising edge of the third clock signal CLK3 and the rising edge of the fourth clock signal CLK4 has the clock interval INTV delay. The third duty correction operation DC3 in the third sub-period DCP_SUB3 of the duty correction period DCP may adjust a second delay time for a falling edge CLK3_FE of the third clock signal CLK3 by comparing the falling edge CLK3_FE of the third clock signal CLK3 with the rising edge of the first clock signal CLK1. The fourth phase correction operation PC4 in the fourth sub-period PCP_SUB4 of the phase correction period PCP may adjust the clock interval INTV delay, such that the rising edge of the fourth clock signal CLK4 and the rising edge of the first clock signal CLK1 has the clock interval INTV delay. The fourth duty correction operation DC4 in the fourth sub-period DCP_SUB4 of the duty correction period DCP may adjust a second delay time for a falling edge CLK4_FE of the fourth clock signal CLK4 by comparing the falling edge CLK4_FE of the fourth clock signal CLK4 with the rising edge of the second clock signal CLK2.

Figure 15:
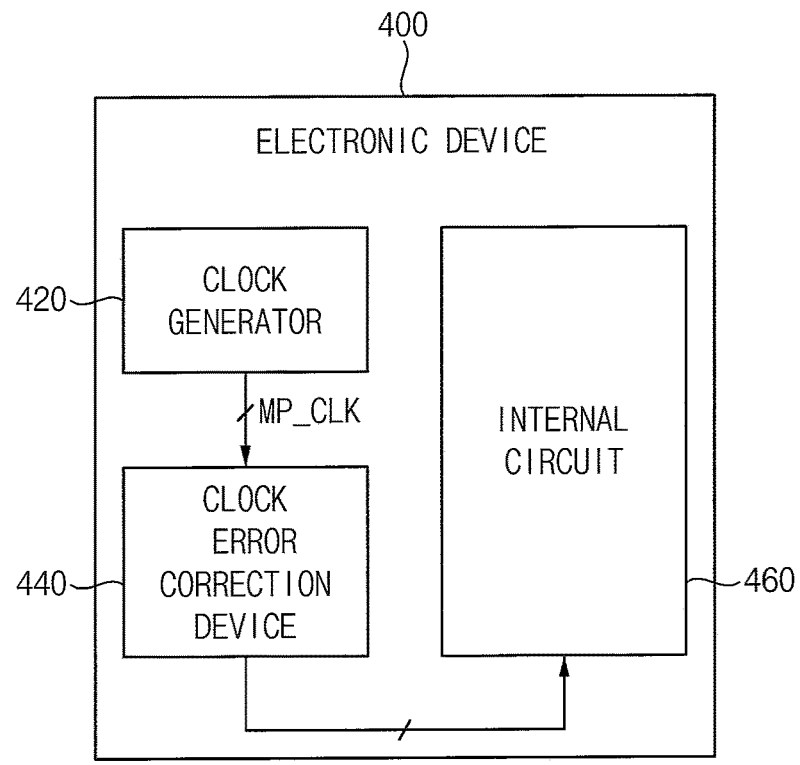
FIG. 15 is a block diagram illustrating an electronic device including a clock error correction device according to example embodiments of the inventive concept.

FIG. 15 is a block diagram illustrating an electronic device including a clock error correction device according to example embodiments of the inventive concept.

Referring to FIG. 15, an electronic device 400 may include a clock generator 420 that generates a multi-phase clock signal MP_CLK, a clock error correction device 440 that performs a correction operation for the multi-phase clock signal MP_CLK, and an internal circuit 460 that operates in synchronization with the multi-phase clock signal MP_CLK output from the clock error correction device 440. The clock error correction device 440 may correct one or both of a phase error and a duty error of the multi-phase clock signal MP_CLK, and the internal circuit 460 may normally operate with no error based on the multi-phase clock signal MP_CLK output from the clock error correction device 440.

Figure 16:
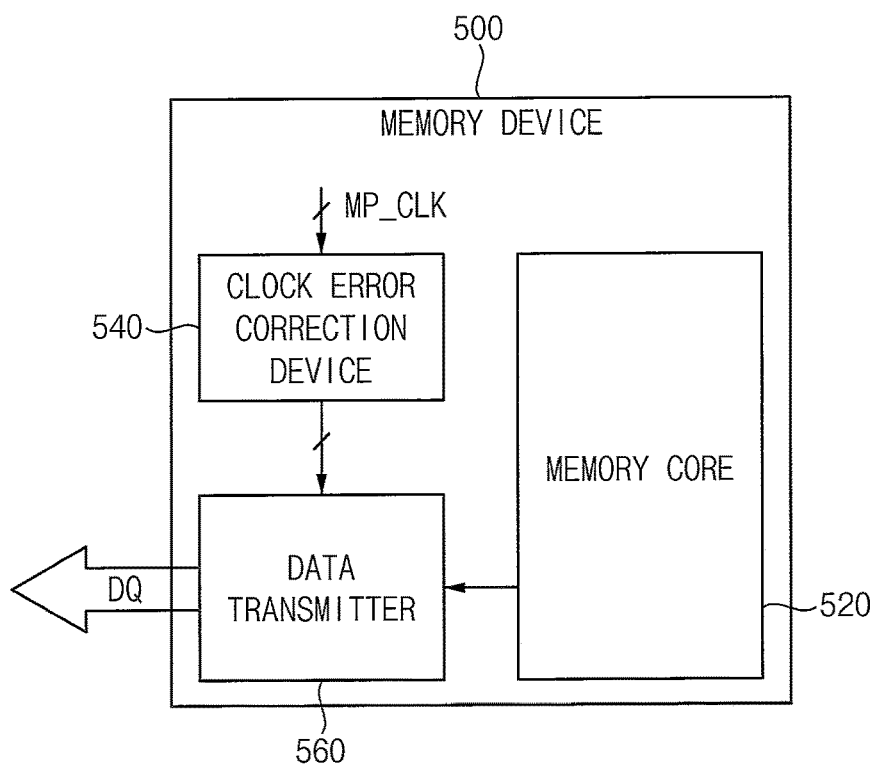
FIG. 16 is a block diagram illustrating a memory device including a clock error correction device according to example embodiments of the inventive concept.

FIG. 16 is a block diagram illustrating a memory device including a clock error correction device according to example embodiments of the inventive concept.

Referring to FIG. 16, a memory device 500 may include a memory core 420 that be configured to store data, a clock error correction device 540 that performs a correction operation for a multi-phase clock signal MP_CLK, and a data transmitter 560 that be configured to transfer output data DQ to a memory controller in response to the multi-phase clock signal MP_CLK output from the clock error correction device 540. The clock error correction device 540 may correct one or both of a phase error and a duty error of the multi-phase clock signal MP_CLK, and the data transmitter 560 may normally transfer the output data DQ with no error based on the multi-phase clock signal MP_CLK output from the clock error correction device 540.

The inventive concept may be applied to various semiconductor circuits or electronic devices using a clock signal. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A clock error correction device for a plurality of clock signals having different phases, the clock error correction device comprising:
   a plurality of delay circuits in paths of the plurality of clock signals, respectively;
   a multi-path selecting circuit configured to select two adjacent clock signals of the plurality of clock signals output from the plurality of delay circuits in a phase correction period, to delay one of the two adjacent clock signals by a clock interval in the phase correction period, to select two opposite clock signals of the plurality of clock signals output from the plurality of delay circuits in a duty correction period, and to invert one of the two opposite clock signals in the duty correction period;

a phase detector configured to compare phases of the two adjacent clock signals output from the multi-path selecting circuit in the phase correction period, and to compare phases of the two opposite clock signals output from the multi-path selecting circuit in the duty correction period; and a code control circuit configured to store an interval code for the clock interval, to store a plurality of delay codes and a plurality of duty codes, to adjust the interval code and the plurality of delay codes in response to an output signal of the phase detector in the phase correction period, and to adjust the plurality of duty codes in response to the output signal of the phase detector in the duty correction period, wherein each of the plurality of delay circuits is configured to adjust a first delay time for both of a first edge and a second edge of a corresponding clock signal of the plurality of clock signals in response to a corresponding delay code of the plurality of delay codes, and to adjust a second delay time for one of the first edge, the second edge, or both the first edge and the second edge of the corresponding clock signal in response to a corresponding duty code of the plurality of duty codes.

2. The clock error correction device of claim 1, wherein the plurality of clock signals include first, second, third and fourth clock signals, and wherein a correction period of the clock error correction device comprises:
  a first sub-period of the phase correction period in which the first delay time for the second clock signal is adjusted, such that the first edge of the first clock signal and the first edge of the second clock signal has the clock interval delay,
  a second sub-period of the phase correction period in which the first delay time for the third clock signal is adjusted, such that the first edge of the second clock signal and the first edge of the third clock signal has the clock interval delay,
  a third sub-period of the phase correction period in which the first delay time for the fourth clock signal is adjusted, such that the first edge of the third clock signal and the first edge of the fourth clock signal has the clock interval delay,
  a fourth sub-period of the phase correction period in which the clock interval is adjusted, such that the first edge of the fourth clock signal and the first edge of the first clock signal has the clock interval delay, and
  wherein the duty correction period in which the second delay time for the second edge of one clock signal among the first, second, third and fourth clock signals is adjusted by comparing the second edge of the one clock signal with the first edge of a clock signal opposite to the one clock signal among the first, second, third and fourth clock signals.

3. The clock error correction device of claim 1, wherein the plurality of clock signals includes first, second, third and fourth clock signals, a first delay code of the plurality of delay codes for the first clock signal is set as a default delay code, and the plurality of delay codes include a second delay code for the second clock signal, a third delay code for the third clock signal, and a fourth delay code for the fourth clock signal, wherein, in a first sub-period of the phase correction period, the multi-path selecting circuit is configured to output the second clock signal and the first clock signal that is delayed by the clock interval, the phase detector is configured to compare the first edge of the second clock signal with the first edge of the first clock signal delayed by the clock interval, and the code control circuit is configured to adjust the second delay code in response to the output signal of the phase detector, wherein, in a second sub-period of the phase correction period, the multi-path selecting circuit is configured to output the third clock signal and the second clock signal that is delayed by the clock interval, the phase detector is configured to compare the first edge of the third clock signal with the first edge of the second clock signal delayed by the clock interval, and the code control circuit is configured to adjust the third delay code in response to the output signal of the phase detector, wherein, in a third sub-period of the phase correction period, the multi-path selecting circuit is configured to output the fourth clock signal and the third clock signal that is delayed by the clock interval, the phase detector is configured to compare the first edge of the fourth clock signal with the first edge of the third clock signal delayed by the clock interval, and the code control circuit is configured to adjust the fourth delay code in response to the output signal of the phase detector, and wherein, in a fourth sub-period of the phase correction period, the multi-path selecting circuit is configured to output the first clock signal and the fourth clock signal that is delayed by the clock interval, the phase detector is configured to compare the first edge of the first clock signal with the first edge of the fourth clock signal delayed by the clock interval, and the code control circuit is configured to adjust the interval code in response to the output signal of the phase detector.

4. The clock error correction device of claim 1, wherein the plurality of clock signals includes first, second, third and fourth clock signals, and the plurality of duty codes includes a first duty code for the first clock signal, a second duty code for the second clock signal, a third duty code for the third clock signal, and a fourth duty code for the fourth clock signal, wherein, in the duty correction period of a first correction period, the multi-path selecting circuit is configured to output a first inverted clock signal by inverting the first clock signal and the third clock signal, the phase detector is configured to compare the first edge of the first inverted clock signal with the first edge of the third clock signal, and the code control circuit is configured to adjust the first duty code in response to the output signal of the phase detector, wherein, in the duty correction period of a second correction period, the multi-path selecting circuit is configured to output a second inverted clock signal and the fourth clock signal by inverting the second clock signal, the phase detector is configured to compare the first edge of the second inverted clock signal with the first edge of the fourth clock signal, and the code control circuit is configured to adjust the second duty code in response to the output signal of the phase detector, wherein, in the duty correction period of a third correction period, the multi-path selecting circuit is configured to output a third inverted clock signal and the first clock signal by inverting the third clock signal, the phase detector is configured to compare the first edge of the third inverted clock signal with the first edge of the first clock signal, and the code control circuit is configured to adjust the third duty code in response to the output signal of the phase detector, and wherein, in the duty correction period of a fourth correction period, the multi-path selecting circuit is configured to output a fourth inverted clock signal and the second clock signal by inverting the fourth clock signal, the phase detector is configured to compare the first edge of the fourth inverted clock signal with the first edge of the second clock signal, and the code control circuit is configured to adjust the fourth duty code in response to the output signal of the phase detector.

5. The clock error correction device of claim 1, wherein the plurality of clock signals includes first, second, third and fourth clock signals, and wherein a correction period of the clock error correction device includes:

a first sub-period of the phase correction period in which the first delay time for the second clock signal is adjusted, such that the first edge of the first clock signal and the first edge of the second clock signal has the clock interval delay, a first sub-period of the duty correction period in which the second delay time for the second edge of the first clock signal is set by comparing the second edge of the first clock signal with the first edge of the third clock signal, a second sub-period of the phase correction period in which the first delay time for the third clock signal is adjusted, such that the first edge of the second clock signal and the first edge of the third clock signal has the clock interval delay, a second sub-period of the duty correction period in which the second delay time for the second edge of the second clock signal is set by comparing the second edge of the second clock signal with the first edge of the fourth clock signal, a third sub-period of the phase correction period in which the first delay time for the fourth clock signal is adjusted, such that the first edge of the third clock signal and the first edge of the fourth clock signal has the clock interval delay, a third sub-period of the duty correction period in which the second delay time for the second edge of the third clock signal is set by comparing the second edge of the third clock signal with the first edge of the first clock signal, a fourth sub-period of the phase correction period in which the clock interval is adjusted, such that the first edge of the fourth clock signal and the first edge of the first clock signal has the clock interval delay, and a fourth sub-period of the duty correction period in which the second delay time for the second edge of the fourth clock signal is set by comparing the second edge of the fourth clock signal with the first edge of the second clock signal.

6. The clock error correction device of claim 1, wherein each of the plurality of delay circuits comprises:

a first signal generator configured to generate a plurality of first switching signals based on the corresponding delay code;

a first inverting circuit including a plurality of first inverters, respective ones of which are selectively turned on in response to the plurality of first switching signals, the first inverting circuit configured to adjust the first delay time for both of the first edge and the second edge of the corresponding clock signal;

a second signal generator configured to generate a plurality of second switching signals based on the corresponding duty code; and a second inverting circuit including a plurality of pull-up units and a plurality of pull-down units, respective ones of the plurality of pull-up units or respective ones of the plurality of pull-down units being selectively turned on in response to respective ones of the plurality of second switching signals, the second inverting circuit configured to adjust the second delay time for the first edge, the second edge, or the first edge and the second edge of the corresponding clock signal.

7. The clock error correction device of claim 1, wherein the multi-path selecting circuit comprises:

a first path;

a second path including a first inverter having a third delay time;

a third path including a delay circuit that is configured to perform a delay operation by the clock interval in response to the interval code;

a fourth path including second and third inverters connected in series and having the third delay time;

a first multiplexer configured to provide one of the plurality of clock signals to the first path in the phase correction period, and to provide a first multiplexed one of the plurality of clock signals to the second path in the duty correction period;

a second multiplexer configured to provide one of the plurality of clock signals to the third path in the phase correction period, and to provide a second multiplexed one of the plurality of clock signals to the fourth path in the duty correction period;

a third multiplexer configured to provide a signal output from the first path to the phase detector in the phase correction period, and to provide a signal output from the second path to the phase detector in the duty correction period; and a fourth multiplexer configured to provide a signal output from the third path to the phase detector in the phase correction period, and to provide a signal output from the fourth path to the phase detector in the duty correction period.

8. The clock error correction device of claim 1, wherein the phase detector comprises:

a comparison circuit configured to generate an output signal by comparing a rising edge of a first input signal received from the multi-path selecting circuit and a rising edge of a second input signal received from the multi-path selecting circuit; and a flip-flop configured to capture the output signal of the comparison circuit responsive to a falling edge of the second input signal.

9. The clock error correction device of claim 1, wherein the code control circuit comprises:

a first shift register configured to store the plurality of delay codes and to store the interval code, and to shift the plurality of delay codes and the interval code in response to a phase correction clock signal;

a first adder configured to add the output signal of the phase detector to a code output from the first shift register;

a second shift register configured to store the plurality of duty codes, and to shift the plurality of duty codes in response to a duty correction clock signal; and a second adder configured to add the output signal of the phase detector to a code output from the second shift register.

10. A clock error correction device for first, second, third and fourth clock signals having different phases, the clock error correction device comprising:
first, second, third and fourth delay circuits in paths of the first, second, third and fourth clock signals, respectively;
a multi-path selecting circuit configured to output the second clock signal and the first clock signal delayed by a clock interval in a first sub-period of a phase correction period, to output the third clock signal and the second clock signal delayed by the clock interval in a second sub-period of the phase correction period, to output the fourth clock signal and the third clock signal delayed by the clock interval in a third sub-period of the phase correction period, to output the first clock signal and the fourth clock signal delayed by the clock interval in a fourth sub-period of the phase correction period, and to output a first inverted clock signal by inverting the first clock signal and the third clock signal in a duty correction period;
a phase detector configured to compare a rising edge of the second clock signal and a rising edge of the first clock signal delayed by the clock interval in the first sub-period of the phase correction period, to compare a rising edge of the third clock signal and a rising edge of the second clock signal delayed by the clock interval in the second sub-period of the phase correction period, to compare a rising edge of the fourth clock signal and a rising edge of the third clock signal delayed by the clock interval in the third sub-period of the phase correction period, to compare a rising edge of the first clock signal and a rising edge of the fourth clock signal delayed by the clock interval in the fourth sub-period of the phase correction period, and to compare a rising edge of the first inverted clock signal and a rising edge of the third clock signal in the duty correction period; and
a code control circuit configured to store an interval code for the clock interval, to store first, second, third and fourth delay codes for the first, second, third and fourth clock signals, and to store first, second, third and fourth duty codes for the first, second, third and fourth clock signals, to adjust the second delay code in response to the output signal of the phase detector in the first sub-period of the phase correction period, to adjust the third delay code in response to the output signal of the phase detector in the second sub-period of the phase correction period, to adjust the fourth delay code in response to the output signal of the phase detector in the third sub-period of the phase correction period, to adjust the interval code in response to the output signal of the phase detector in the fourth sub-period of the phase correction period, and to adjust the first duty code in response to the output signal of the phase detector in the duty correction period,
wherein each of the first, second, third and fourth delay circuits is configured to adjust a first delay time for both of a rising edge and a falling edge of a corresponding clock signal of the first, second, third and fourth clock signals in response to a corresponding delay code of the first, second, third and fourth delay codes, and is configured to adjust a second delay time for the rising edge, the falling edge, or both of the rising edge and the falling edge of the corresponding clock signal in response to a corresponding duty code of the first, second, third and fourth duty codes, and
wherein the multi-path selecting circuit is configured to adjust the clock interval in response to the interval code.

11. The clock error correction device of claim 10, wherein each of the first, second, third and fourth delay circuits comprises:
a first signal generator configured to generate a plurality of first switching signals based on the corresponding delay code;
a first inverting circuit including a plurality of first inverters respective ones of which are selectively turned on in response to the plurality of first switching signals, the first inverting circuit configured to adjust the first delay time for both of the rising edge and the falling edge of the corresponding clock signal;
a second signal generator configured to generate a plurality of second switching signals based on the corresponding duty code; and
a second inverting circuit including a plurality of pull-up units and a plurality of pull-down units, respective ones of the plurality of pull-up units or respective ones of the plurality of pull-down units being selectively turned on in response to respective ones the plurality of second switching signals, the second inverting circuit configured to adjust the second delay time for the rising edge, the falling edge, or both of the rising edge and the falling edge of the corresponding clock signal.

\* \* \* \* \*